United States Patent
Morton et al.

(10) Patent No.: US 7,830,716 B2
(45) Date of Patent: Nov. 9, 2010

(54) NON-VOLATILE MEMORY STRING MODULE WITH BUFFER AND METHOD

(75) Inventors: Bruce Lee Morton, Lakeway, TX (US); Michael VanBuskirk, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 137 days.

(21) Appl. No.: 12/134,898

(22) Filed: Jun. 6, 2008

(65) Prior Publication Data

US 2009/0303793 A1    Dec. 10, 2009

(51) Int. Cl.
G11C 16/04    (2006.01)

(52) U.S. Cl. .......................... 365/185.17; 365/185.13; 365/185.21

(58) Field of Classification Search ............ 365/185.13, 365/185.17, 185.21
See application file for complete search history.

(56) References Cited

U.S. PATENT DOCUMENTS

| | | | |
|---|---|---|---|
| 4,523,110 A | | 6/1985 | Johnson |
| 4,549,299 A | | 10/1985 | Palma et al. |
| 4,567,445 A | | 1/1986 | Berg |
| 5,416,918 A | | 5/1995 | Gleason et al. |
| 5,590,074 A | * | 12/1996 | Akaogi et al. .......... 365/185.22 |
| 5,672,989 A | | 9/1997 | Jang et al. |
| 5,717,640 A | * | 2/1998 | Hashimoto ............. 365/189.07 |
| 5,732,018 A | | 3/1998 | Choi et al. |
| 5,768,191 A | * | 6/1998 | Choi et al. ............. 365/185.22 |
| 5,805,498 A | * | 9/1998 | Lee et al. ............... 365/185.17 |
| 5,946,238 A | * | 8/1999 | Campardo et al. ....... 365/185.2 |
| 6,154,864 A | | 11/2000 | Merritt |
| 6,195,279 B1 | | 2/2001 | Townley et al. |
| 6,344,760 B1 | | 2/2002 | Pyo |
| 6,449,202 B1 | | 9/2002 | Akatsu et al. |
| 6,914,812 B2 | | 7/2005 | Owen |
| 2002/0186591 A1 | * | 12/2002 | Lee et al. ............... 365/185.17 |
| 2004/0145024 A1 | | 7/2004 | Chen et al. |
| 2005/0078519 A1 | | 4/2005 | Shiga |
| 2006/0034122 A1 | | 2/2006 | Betser et al. |
| 2007/0147113 A1 | * | 6/2007 | Mokhlesi et al. ....... 365/185.03 |

OTHER PUBLICATIONS

Jung, et al., "A 3.3-V Single Power Supply 16-Mb Nonvolatile Virtual DRAM Using a NAND Flash Memory Technology," IEEE Journal of Solid State Circuits, vol. 32, No. 11, Nov. 1997, pp. 1748-1757.
U.S. Appl. No. 12/134,905, Office Action mailed Oct. 6, 2009, 7 pages.
NPL-U.S. Appl. No. 12/134,902, filed Jun. 6, 2008, entitled "Memory Device and Method".

(Continued)

*Primary Examiner*—Hoai V Ho

(57) ABSTRACT

During first portion of a first read cycle determining that a first input of a sense amplifier is to receive information based upon a state of a storage cell during a first portion of a read cycle, and determining that a conductance at the first input is substantially equal to a conductance at a second input of the sense amplifier during the first portion. A plurality of NAND string modules are connected to a global bit line of a memory device that includes a memory column where a plurality of NAND strings and a buffer are formed.

20 Claims, 23 Drawing Sheets

OTHER PUBLICATIONS

U.S. Appl. No. 12/134,905, filed Jun. 6, 2008, entitled "Memory Device and Method".
U.S. Appl. No. 12/134,902, Notice of Allowance mailed Jan. 28, 2010, 9 pages.
Notice of Allowance mailed May 19, 2010 for U.S. Appl. No. 12/134,902; 10 pages.
Non-Final Office Action mailed Aug. 25, 2010 for U.S. Appl. No. 12/134,905; 9 pages.

* cited by examiner

NON-VOLATILE MEMORY STRING MODULE WITH BUFFER AND METHOD

CROSS-REFERENCE TO RELATED APPLICATIONS

The present disclosure is related to U.S. patent application Ser. No. 12/134,902, filed on an even date herewith and entitled "MEMORY DEVICE AND METHOD," and U.S. patent application Ser. No. 12/134,905, filed on an even date herewith and entitled "MEMORY DEVICE AND METHOD," the entirety of which is incorporated by reference herein.

BACKGROUND

1. Field of the Disclosure

The present disclosure relates generally to memory devices and more particularly to a non-volatile memory device 2. Description of the Related Art Existing flash memories, such as NAND-type flash memories, are not scalable to Giga-bit densities without a substantial loss of performance. A flash memory that is capable of high-speeds and high densities would be useful.

BRIEF DESCRIPTION OF THE DRAWINGS

The present disclosure may be better understood, and its numerous features and advantages made apparent to those skilled in the art by referencing the accompanying drawings.

DETAILED DESCRIPTION

Figure 1:
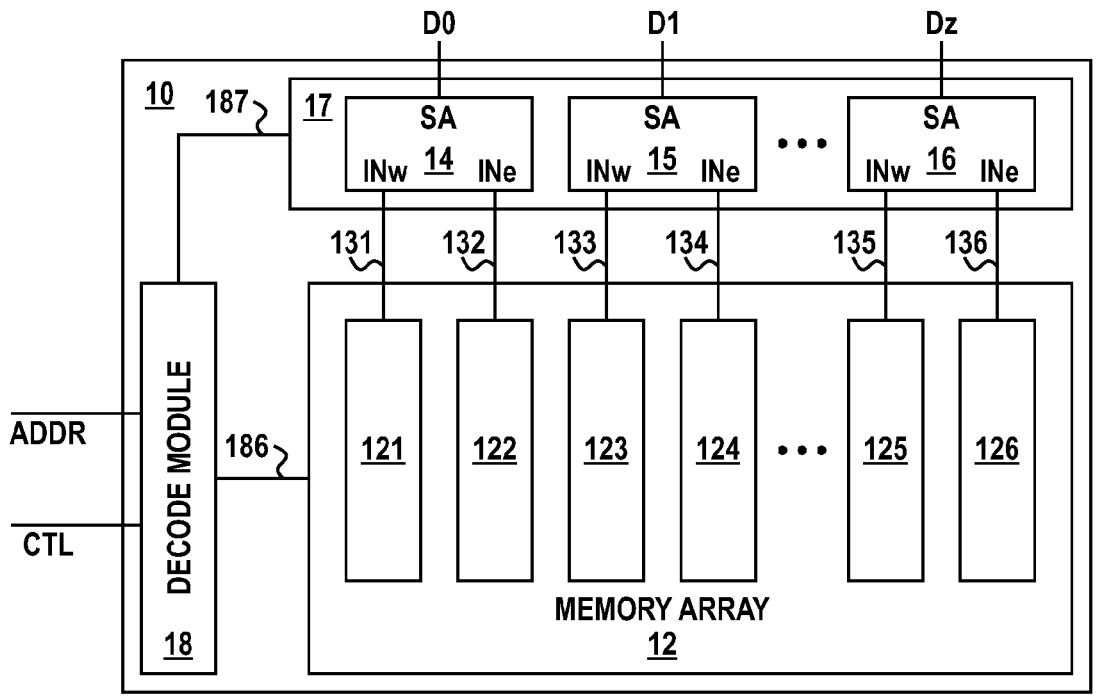
FIG. 1 illustrates a block diagram of memory device in accordance with a specific embodiment of the present disclosure.

FIG. 1 illustrates a block diagram of a memory device 10 in accordance with a specific embodiment of the present disclosure. Memory device 10 is illustrated to include a memory array 12, a sense amplifier module 17, and a decode module 18. The memory array 12 is connected to the sense amplifier module 17 to receive information by global bit lines 131-136. The memory array 12 is connected to the decode module 18 to receive information by connections 186. The sense amplifier module 17 is connected to the decode module 18 to receive information by connections 187.

Sense amplifier module 17 includes sense amplifiers 14-16 that provide data bits D0-Dz, where "z" indicates a number of sense amplifiers accessing data. In one embodiment of the present disclosure, each sense amplifier of sense amplifiers 14-16 provides one logic value at its output when it determines a common conductance is present at its inputs during a read cycle, and provides a different logic value at its output when it determines there is not a common conductance present at its inputs during the read cycle. For purposes of discussion herein, the memory device 10 is primarily described with respect to a read cycle that accesses information stored at a storage cell of the memory device 16. Therefore, it will be appreciated that inputs to some devices described herein, such as sense amplifier 14, with respect to a read operation can also function as outputs during a write operation, and that outputs of some devices during a read operation can also function as input during a write operation.

Memory array 12 includes a plurality of sub arrays 121-126 that respectively include a plurality of memory array columns. Each sub array of the plurality of sub arrays 121-126 is respectively connected to a corresponding global bit line of the global bit lines 131-136. Each sub array of the plurality of sub arrays 121-126 respectively includes a corresponding plurality of storage elements, also referred to as storage cells, that store information to be communicated to the sub array's corresponding global bit line. In one embodiment of the present disclosure, the sense amplifiers 14-16 determine a storage state of a storage element, which can be volatile or non-volatile, based upon a relative conductance at a first input and at a second input of the sense amplifier. In another embodiment of the present disclosure, each respective storage element of memory array 12 is non-volatile and associated with a corresponding NAND string, and the sense amplifiers 14-16 can detect a relative conductance or other characteristics at their inputs indicative of a storage state of the storage element being read.

During normal operation, the decode module 18 provides control signals to the memory array 12 via interconnects 186 to the sense amplifier module 17 via interconnects 187 as described herein to access specific storage elements of memory array 12. Various aspects of the memory device 10 will be better understood with reference to FIGS. 2-7.

Figure 2:
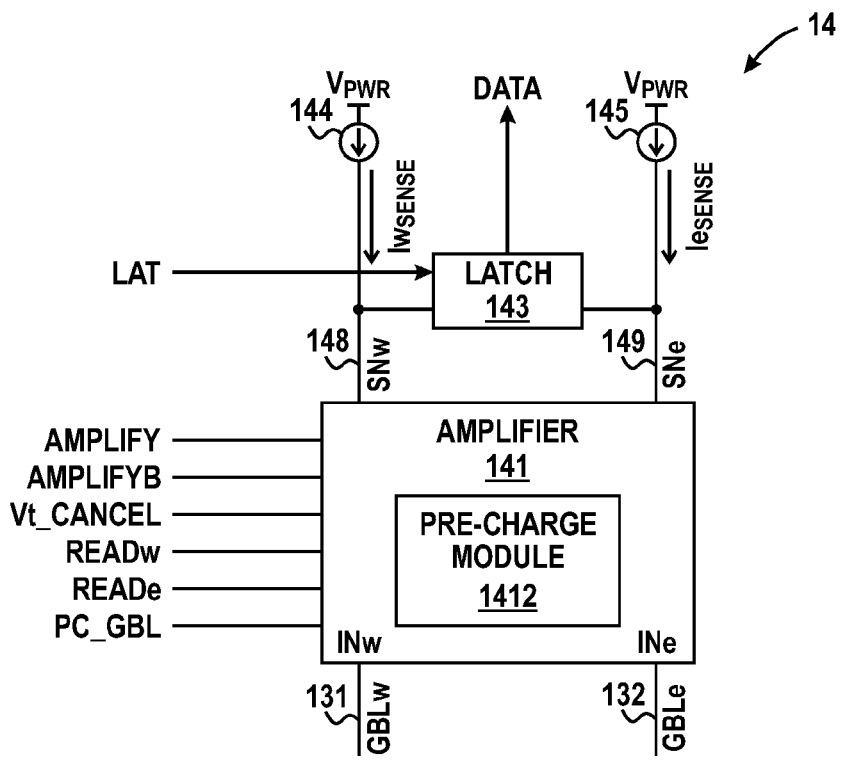
FIG. 2 illustrates a block diagram of a sense amplifier in accordance with a specific embodiment of the present disclosure.

FIG. 2 illustrates a block diagram of specific embodiment of sense amplifier 14 of FIG. 1. The sense amplifier 14 includes amplifier 141, latch 143, a sense node 148 also labeled SNw, a sense node 149 also labeled SNe, current source 144 to provide a reference current $Iw_{sense}$, and current source 145 to provide reference current $Ie_{sense}$. Amplifier 141 is illustrated to include a pre-charge module 1412. It will be appreciated that each of the sense amplifiers of sense amplifier module 17 will typically be the same as sense amplifier 14.

The sense amplifier 14 is connected to the memory array 12 at an input of amplifier 141 labeled INw that is connected to interconnect 131, which is a global bit line also labeled GBLw, and at an input labeled INe connected to interconnect 132 that is a global bit line also labeled GBLe. The amplifier 141 is connected to the decode module 18 by various interconnects of interconnects 187 including: an interconnect labeled AMPLIFY; an interconnect labeled AMPLIFYB; an interconnect labeled Vt_CANCEL; an interconnect labeled READw; an interconnect labeled READe; and an interconnect labeled PC_GBL. These interconnects are associated with reading data from memory array 12, and providing a differential signal at the sense nodes SNw and SNe.

Latch 143 is connected to the sense nodes SNw and SNe and to the decode module 18 by an interconnect labeled LAT, of interconnects 187. Data from the latch 143 is provided to an output of the sense amplifier 14 labeled DATA. Operation of sense amplifier 14 of FIG. 2 will be better understood with reference to FIGS. 3-7 herein.

Figure 3:
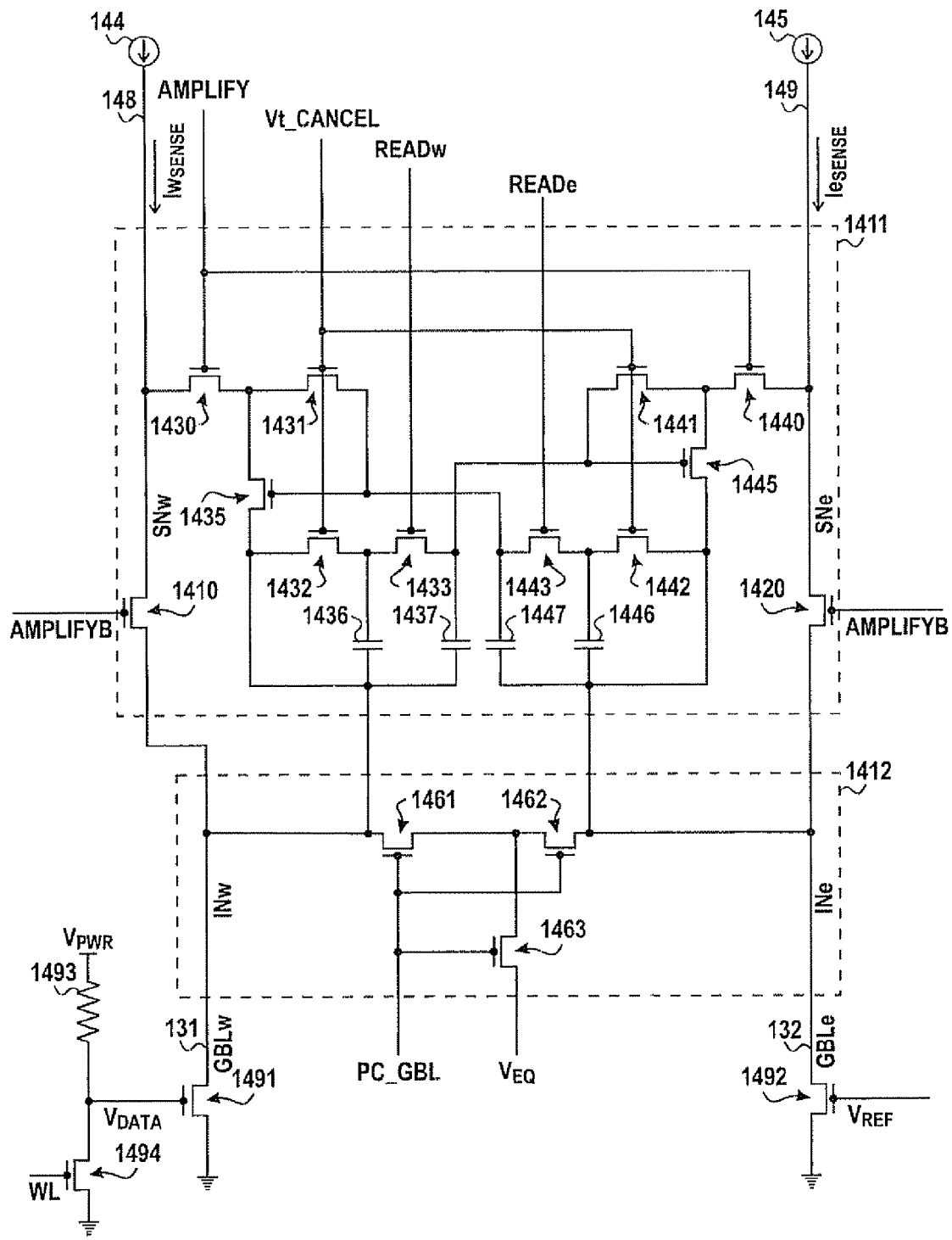
FIG. 3 illustrates a circuit diagram of a portion of the sense amplifier of FIG. 2 in accordance with a specific embodiment of the present disclosure.

FIG. 3 illustrates global bit line GBLw, global bit line GBLe, N-type field effect transistors (FETs) 1491 and 1492, resistive element 1493, storage cell 1494, and a circuit representing a more detailed view of a portion 1411 and pre-charge module 1412 of the amplifier 141 of FIG. 2.

The pre-charge module 1412 of amplifier 141 includes N-type FETs 1461-1463. Portion 1411 of amplifier 141 implements a differential amplifier during operation and includes: N-type FETs 1410, 1420, 1430-1433, and 1440-1443; and capacitors 1436, 1437, 1446, and 1447.

Transistor 1410 includes a control electrode, e.g. a gate, connected to a node labeled AMPLIFYB, a first current electrode, e.g. a source/drain electrode, and a second current electrode connected to INw. Transistor 1430 includes a control electrode, e.g. a gate, connected to a node labeled AMPLIFY, a first current electrode, e.g., a source or drain, connected to the first current electrode of transistor 1410, and a second current electrode. Transistor 1431 includes a control electrode connected to a node labeled Vt_CANCEL, a first current electrode connected to the second current electrode of transistor 1430, and a second current electrode. Transistor 1435 includes a control electrode, a first current electrode connected to the first current electrode of transistor 1431, and a second current electrode connected to the second current electrode of transistor 1410. Transistor 1432 includes a control electrode connected to a node labeled Vt_CANCEL, a first current electrode connected to the second current electrode of transistor 1435, and a second current electrode. Transistor 1433 includes a control electrode connected to a node labeled READw, a first current electrode connected to the second current electrode of transistor 1432, and a second current electrode. Capacitor 1436 includes a first electrode connected to the second current electrode of transistor 1432, and a second electrode connected to the second current electrode of transistor 1435. Capacitor 1437 includes a first electrode connected to the second current electrode of transistor 1433, and a second electrode connected to the second current electrode of transistor 1435.

Transistor 1420 includes a control electrode connected to a node labeled AMPLIFYB, a first current electrode, and a second current electrode connected to INe. Transistor 1440 includes a control electrode connected to a node labeled AMPLIFY, a first current electrode connected to the first current electrode of transistor 1420, and a second current electrode. Transistor 1441 includes a control electrode connected to a node labeled Vt_CANCEL, a first current electrode connected to the second current electrode of transistor 1440, and a second current electrode. Transistor 1445 includes a control electrode connected to the first electrode of capacitor 1437, a first current electrode connected to the first current electrode of transistor 1441, and a second current electrode connected to the second current electrode of transistor 1420. Transistor 1442 includes a control electrode connected to the node labeled Vt_CANCEL, a first current electrode connected to the second current electrode of transistor 1445, and a second current electrode. Transistor 1443 includes a control electrode connected to the node labeled READe, a first current electrode connected to the second current electrode of transistor 1442, and a second current electrode connected to the control electrode of transistor 1435. Capacitor 1446 includes a first electrode connected to the second current electrode of transistor 1442, and a second electrode connected to the second current electrode of transistor 1445. Capacitor 1447 includes a first electrode connected to the second current electrode of transistor 1443, and a second electrode connected to the second current electrode of transistor 1445.

Transistors 1410, 1430-1433, 1420, 1440-1443, and 1461-1463 are also referred to as switches, in that they are controlled by logic signals that result in their operating effectively as a switch that is open or closed to allow or prevent information from being communicated there through.

Transistor 1491 operates as a buffer in a sense path of memory device 10 that also includes a storage cell 1492 that is being read. The control electrode of transistor 1491 is biased at reference voltage $V_{PWR}$ during a portion of a read cycle if the storage cell being read is in a non-conductive state, and will be biased at a lower voltage, such as at reference voltage near $V_{GND}$, during the portion of the read cycle if the storage cell being read is in a conductive state. The source of transistor 1491 is connected to $V_{GND}$. The drain of transistor 1491 is connected to GBLw. Transistor 1491 is configured as an open drain buffer, whereby transistor 1491 is turned off in response to $V_{GND}$ being applied to its control gate, which results in the output of transistor 1491 communicating a conductive state of a storage cell 1494 when being read, by generating a high-impedance at its output, e.g., the drain of transistor 1491 is isolated from its source. Transistor 1491 is turned on in response to $V_{PWR}$ being applied to its control gate, which results in the output of transistor 1491 communicating a non-conductive state of a storage cell being read by generating a low-impedance at its output, e.g., charge at GBLw is allowed to flow from the output of transistor 1491, i.e., its drain, to the interconnect $V_{GND}$.

Storage cell 1494 can be a NAND storage cell of a NAND string, and is illustrated as a transistor that includes a control electrode, a first current electrode, and a second current electrode. A charge can be stored at the storage cell 1494 causing it to be more or less conductive in response to a read bias signal being asserted at its control electrode during a read operation. For purposes of discussion with respect to FIG. 3, the storage cell 1494 is being read, and therefore the control gate is receiving an asserted read bias signal at node WL. A source electrode of storage cell 1494 is illustrated as being connected to a node at a ground potential, and a drain electrode of storage cell 1494 is illustrated as being connected to the control gate of transistor 1491. In response to the bias signal being asserted at node WL when storage cell 1494 is conductive, the voltage $V_{DATA}$ will be less than the reference voltage provided to node $V_{PWR}$. For example, $V_{DATA}$ may be near $V_{GND}$. In response to the bias signal being asserted at node WL when storage cell 1494 is non-conductive, the voltage, $V_{DATA}$, will be at the reference voltage $V_{PWR}$.

Figure 4:
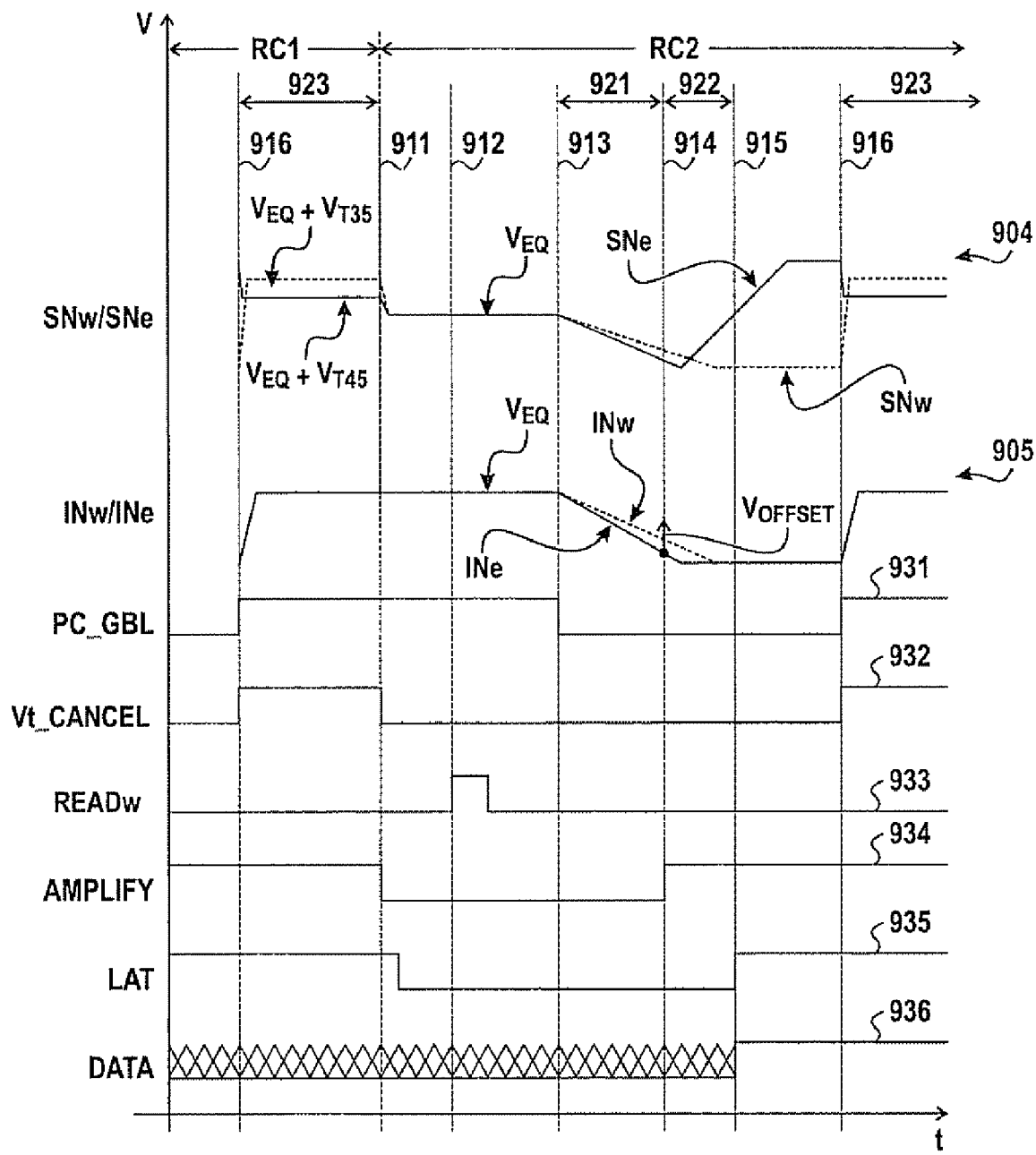
FIG. 4 illustrates a timing diagram associated with the portion of the sense amplifier of FIG. 3 where a non-conductive memory cell is being read.

FIG. 4 illustrates a timing diagram for a read cycle during which storage cell 1494 is being read while in a conductive state. For purposes of discussion, a read cycle is described from time 916 of RC1 to time 916 or RC2, which includes portions of two formal read cycles, RC1 and RC2. At time portion 923 of the read cycle RC1, signals PC_GBL, represented by timing trace 931, VT_CANCEL, represented by timing trace 932, and AMPLIFY, represented by timing trace 934, are asserted.

In response to PC_GBL being asserted at time 916 of RC1, a defined voltage, $V_{EQ}$, is provided to both GBLw and GBLe, resulting in both GBLw and GBLe being driven to $V_{EQ}$ at time period 923 of RC1. $V_{EQ}$ is also referred to as a pre-charge voltage in that the global bit lines GBLw and GBLe are pre-charged to this voltage. Therefore, because transistors 1461 and 1462 can be simultaneously closed, the bottom electrode of capacitor 1447 is selectively communicatively connected to the input INw, and the bottom electrode of capacitor 1437 is selectively communicatively connected to the input INe.

As described above, the control electrode of transistor 1435 is selectively communicatively connected to its drain by transistor 1431. For example, in response to Vt_CANCEL being asserted at time 916 of RC1, switch 1431 is closed to connect the gate and drain of transistor 1435 together, and switch 1441 of amplifier 141 is closed to connect the gate and drain of transistor 1445 together. Assertion of VT_CANCEL also results in switches 1432 and 1442 being closed to connect the two electrodes of capacitor 1436 together, and to connect the two electrodes of capacitor 1446 together.

In response to AMPLIFY being asserted at time 923 of RC1, and therefore AMPLIFYB being negated (not shown), switches 1410 and 1420 are open, and switches 1430 and 1440 are closed to force current Iw$_{sense}$ and current Ie$_{sense}$ through transistors 1435 and 1445, respectively, during pre-charge. Note that current Ie$_{sense}$ and current Iw$_{sense}$ are typically matched currents. In response to forcing current Iw$_{sense}$ through transistor 1435 while its gate and drain are connected, a voltage between the gate and source of transistor 1435 will be set at the threshold voltage of transistor 1435 (Vt$_{1435}$), and a voltage equal to $V_{EQ}$+Vt$_{1435}$ will be provided to the sense node SNw as indicated during time 916 of RC1. Similarly, a voltage between the source and gate of transistor 1445 will be set at the threshold voltage of transistor 1445 (Vt$_{1445}$), and a voltage equal to $V_{EQ}$+Vt$_{1445}$ will be provided to the sense node SNe.

A closed loop circuit path is formed as follows: the drain of transistor 1435 is electrically connected, through closed switch 1431 to an electrode of capacitor 1447, the other electrode of capacitor 1447 is electrically connected to the source of transistor 1435, through closed switches 1461 and 1462. As a result of this closed loop circuit path, capacitor 1447 is charged to threshold voltage of transistor 1435 (Vt$_{1435}$) that results between the source and drain of transistor 1435 during time 916. Another closed loop circuit path is formed as follows: the drain of transistor 1445 is electrically connected to an electrode of capacitor 1437, through switch 1441, the other electrode of capacitor 1437 is electrically to the source of transistor 1445, through switches 1461 and 1462. As a result of this closed loop circuit path, capacitor 1437 is charged to the threshold voltage of transistor 1445 (Vt$_{1445}$). As will be described further herein, the effect of storing charges at capacitors 1437 and 1447 is to provide transistor 1435 and transistor 1445 with identical effective voltage thresholds of zero volts when operating as part of a differential amplifier.

Time 911 represents the beginning of a formal read cycle labeled RC2. At time 911, signals Vt_CANCEL and AMPLIFY are negated. In response to Vt_CANCEL being negated, switches 1431 and 1441 are opened, whereby the gate and drain of transistor 1435 are no longer electrically connected together, and the gate and drain of transistor 1445 are no longer electrically connected together. In response to AMPLIFY being negated at time 911, and AMPLIFYB being asserted (not shown), switch 1410 is closed while switch 1430 is opened, thereby redirecting the current Iw$_{sense}$ from through switch 1430 to GBLw, which is connected to INw, through switch 1410. Similarly, in response to AMPLIFY being negated switch 1420 is closed while switch 1440 is opened, thereby redirecting the current Ie$_{sense}$ from through switch 1440 to GBLe, which is connected to INe, through switch 1420.

In further response to switch 1410 and switch 1420 being closed at time 911, voltages at SNw and SNe will be set to the pre-charge voltage ($V_{EQ}$) being applied to GBLw and GBLe. During the time from 911 to 912 a closed loop circuit path is formed as follows: from the gate of transistor 1435 to an electrode of capacitor 1447, to the other electrode of capacitor 1447, to the source of transistor 1435 through closed switches 1461, and 1462. As a result of this closed loop circuit path the gate of transistor 1435 is biased above the voltage ($V_{EQ}$) at the source of transistor 1435 by the voltage at capacitor 1447, i.e., Vt$_{1435}$. Another closed loop circuit path is formed as follows: from the gate of transistor 1445 to an electrode of capacitor 1437, to the other electrode of capacitor 1437, to the source of transistor 1445 through closed switches 1461, and 1462. As a result of this closed loop circuit path the gate of transistor 1445 is biased above the voltage ($V_{EQ}$) at the source of transistor 1445 by the voltage at capacitor 1437, i.e., Vt$_{1445}$.

At time 912 of RC2, one of the signals READw or READe is asserted. Signal READw is asserted if during the current read cycle data is being read at bit line GBLw. Signal READe is asserted if data during the current read cycle is being read at bit line GBLe. For purposes of discussion it assumed that storage location 1494 is being read resulting in data information at GBLw, therefore, READw is asserted.

In response to READw being asserted, a portion of the charge stored at capacitor 1437 is shared with capacitor 1436, thereby modifying the voltage across capacitor 1437 by an offset amount, Voffset, that will affect the effective Vt of transistor 1445 during a subsequent amplify phase of the read cycle RC2. The value of Voffset is defined based upon the size of capacitor 1436 relative to the size of capacitor 1437, which is defined to obtain a desired Voffset. For example, assume that prior to switch 1433 being closed capacitor 1437 has a storage area of 9 area units and a charge of 10 charge units, and the capacitor 1436 has a storage area of 1 area unit and a charge of 0 charge units. After switch 1433 is closed at time 912, 1 charge unit will be stored at the capacitor 1436 and 9 charge units will be stored at capacitor 1437. This approximate 11% drop in charge units at capacitor 1437 corresponds to an approximate 11% drop of the voltage across transistor 1445, and therefore an approximate 11% drop in the effective Vt of transistor 1445. Signal READw is negated prior to time 913. Voffset can be in the range of approximately less than one-half a voltage threshold of the transistor it is biasing, such as transistor 1445, and greater than the voltage offset due to natural mismatch between adjacent devices, such as transistors 1435 and 1445 or capacitors 1437 and 1447. For example, the Voffset can be in the range of approximately 750-20 millivolts, such as less than 300 millivolts, less than 250 millivolts, less than 200 millivolts, less than 150 millivolts, less than 100 millivolts, and less than 100 millivolts.

At time 913, signal PC_GBL is negated to electrically isolate GBLw from GBLe. Therefore, while the bottom electrode of capacitor 1447 is electrically connected to both INw and INe during the time period prior to the beginning of time 913, during time period 921, the bottom electrode of capacitor 1447 is electrically connected to INe, but is not electrically connected to INw. Note that INw represents a node of sense amplifier 14 that is electrically connected to GBLw and that INe represents a node of sense amplifier 14 that is electrically connected to GBLe during the read cycle RC2. The time period 921, from when PC_GBL is negated until AMPLIFY is asserted is referred to as the integration period 921. During the integration period 921, transistor 1492 acts as a reference transistor having a reference conductance based upon the voltage Vref, and transistor 1491 acts as a buffer for signal Vdata and will have a conductance, referred to as a data conductance, that is based upon a program state of the storage cell 1494. The data conductance will be either matched or significantly different than the reference conductance.

During integration period 921, the transistor 1492 is highly conductive due to storage cell 1494 being non-conductive. When transistor 1492 is highly conductive charge at SNe, e.g., charge introduced by current Ie$_{sense}$, flows to ground, whereby a voltage at SNe transitions from V$_{EQ}$ toward ground at a first rate that is based upon the current Ie$_{sense}$ and the conductance of GBLe at INe.

In response to the storage cell 1494 being read during time period RC2 while in a non-conductive state, and in response to Vref being equal to V$_{PWR}$, the voltage Vdata at the gate of transistor 1491 will be the same as the voltage Vref at the beginning of the integration period 921. As a result, the conductances at the inputs INw and INe of the sense amplifier are the same, assuming transistors 1491 and 1492 are matched transistors. Therefore, INw transitions from V$_{EQ}$ toward ground at a rate that INe transitions from V$_{EQ}$ toward ground. As a result, at the end of the integration period 921 of RC2 the data signals at INw and SNw are at substantially the same voltage as the reference signal at INe and SNe. For example, the data signal voltage, e.g., the voltage at INw, is less than the sum of reference signal at INe (V$_{INe}$) and offset voltage Voffset. Therefore, when V$_{INw}$ is less than V$_{INe}$+Voffset at the end of the integration period 921, the conductance at the input INw of the sense amplifier 14 is considered to be substantially the same as the conductance of the second input of the sense amplifier during the integration period 921.

A time period 922 begins at time 914 when the signal AMPLIFY is asserted, and AMPLIFYB negated (not shown). During time period 922, transistors 1410 and 1420 are opened to isolate SNw from INw and SNe from INe. During time period 922, transistors 1430 and 1440 are closed to communicate information at sense nodes SNw and SNe to the drain electrodes of transistors 1435 and 1445, respectively.

During time period 922 of read cycle RC2, the gate and source of transistor 1445 are biased as follows: the source of transistor 1445 is biased at the voltage at INe, which is the voltage V$_{GBLe}$ at GBLe, and the gate of transistor 1445 is biased by the sum of the voltage at INw, which is the voltage V$_{GBLw}$ at GBLw, and the voltage across capacitor 1437, which is (V$_{T1445}$−Voffset). The gate to source voltage drop at transistor 1445 is therefore equal to V$_{INw}$+(V$_{T1445}$−Voffset)−V$_{INe}$. Therefore, the effective Vt of transistor 1445 with respect to INw and INe is Voffset, whereby transistor 1445 will remain off during time period 922 of RC2 because the voltage V$_{INe}$ is less than the sum of V$_{INw}$ and Voffset. As a result of transistor 1445 being turned off during time period 922 of read cycle 922, V$_{SNE}$ increases while voltage V$_{INe}$ remains at, or continues its transition to, V$_{GND}$.

During time period 922 of read cycle RC2, the gate and source of transistor 1435 are biased as follows: the source of transistor 1435 is biased at the voltage at INw, which is the voltage V$_{GBLw}$ at GBLw; and the gate of transistor 1435 is biased by the sum of the voltage at INe, which is the voltage V$_{GBLe}$ at GBLe, and the voltage V$_{T1435}$ across capacitor 1447. The gate to source voltage drop at transistor 1435 is therefore equal to V$_{INe}$+V$_{T1435}$−V$_{INw}$. Therefore, the effective Vt of transistor 1435 with respect to INe and INw is zero, whereby transistor 1435 will begin to turn on when the voltage V$_{INw}$ is equal to or greater than V$_{INe}$. Since V$_{INw}$ and V$_{INe}$ are transitioning toward the same reference voltage, e.g., V$_{GND}$, transistor 1435 will turn on during time period 922 of read cycle RC2, thereby maintaining V$_{SNw}$ at a relatively low voltage as compared to voltage V$_{SNe}$, and assuring the voltage at V$_{GBLw}$ remains at or above the voltage at V$_{GBLe}$.

At time 915 a latch signal LAT is asserted to latch a first logic state, illustrated as a high voltage level at FIG. 4, based upon the voltage difference between V(SNw) and V(SNe).

At time 916, signals PC_GBL and Vt_CANCEL are asserted as previously described.

Figure 5:
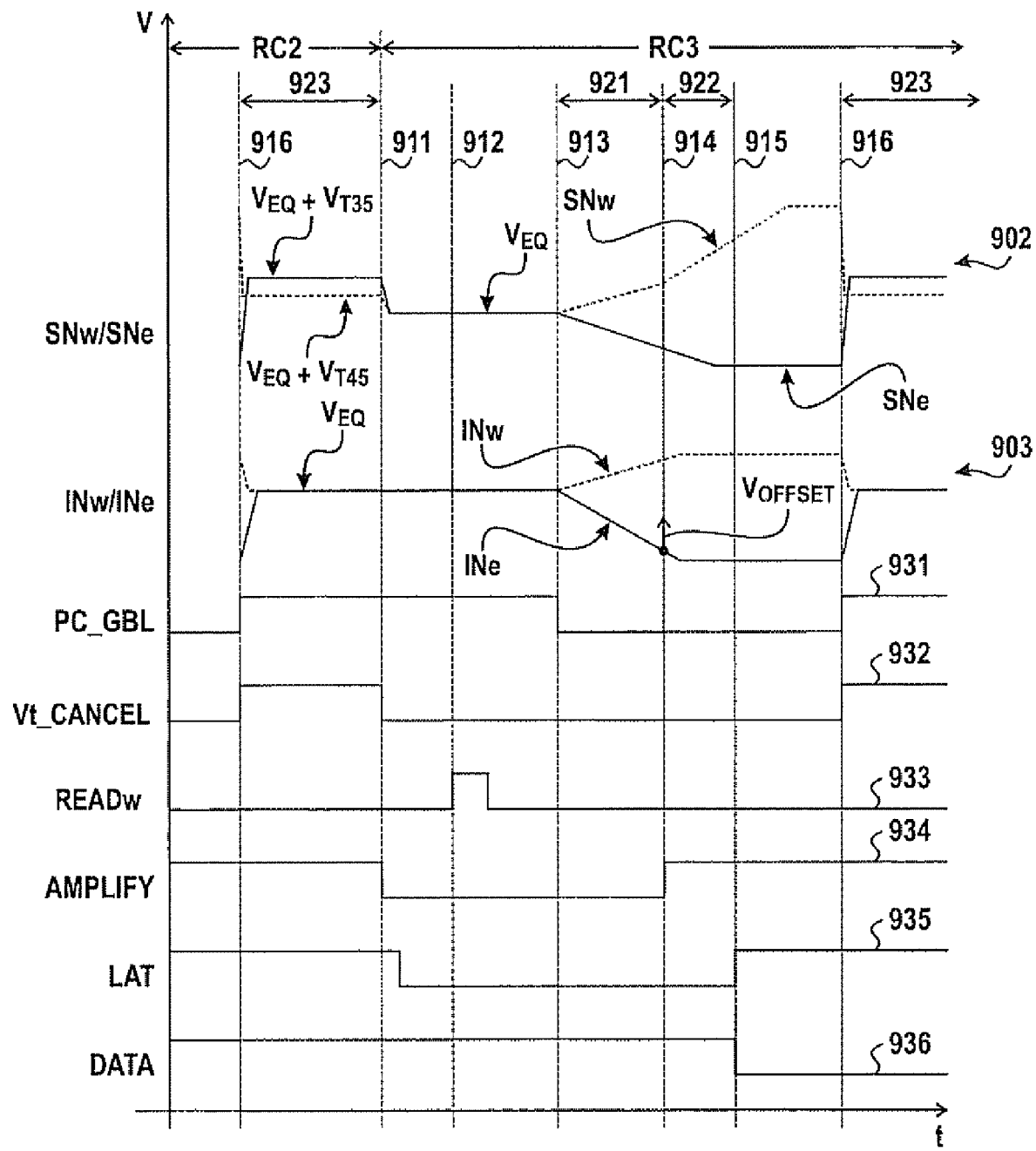
FIG. 5 illustrates a timing diagram associated with the portion of the sense amplifier of FIG. 3 where a conductive memory cell is being read.

FIG. 5 illustrates the end of read cycle RC2 and the beginning of a new read cycle labeled RC3. Operation of the sense amplifier 141 is the same from time 912 until time 914 of read cycle RC3 as previously described for read cycle RC2. Therefore, transistors 1435 and 1445 are biased in the same manner just prior to the beginning of the integration period 921 of read cycle RC3 as just prior to the beginning of the integration period 921 of RC2. However, during read cycle RC3, storage cell 1494 is in a conductive state resulting in Vdata having a voltage less than the voltage of V$_{REF}$. For example, at time 914 Vdata can be at or near V$_{GND}$ and V$_{REF}$ can be at V$_{PWR}$.

During integration period 921 of read cycle RC3, the transistor 1491 is non-conductive due to storage cell 1494 being conductive. When transistor 1491 is non-conductive, charge introduced by current Iw$_{sense}$, remains at SNw and GBLw, which causes the voltage at SNw and SNw to increase as illustrated at FIG. 5. However, the voltage at SNe and GBLe transitions from V$_{EQ}$ toward ground as previously described since transistor 1492 has the same conductance as previously described based upon the reference signal Vref.

Therefore, at the beginning of the amplify period 922 of read cycle RC3, the voltage V$_{INw}$ is greater than the sum of V$_{INe}$ and Voffset causing transistor 1445 to be turned on and transistor 1435 being turned off. As a result of transistor 1445 being turned on during time period 922 of read cycle RC3, V$_{SNe}$ remains at, or continues its transition to, V$_{GND}$ along with V$_{INe}$, while V$_{SNw}$ increases as a result of transistor 1435 being turned off during time period 922 of read cycle RC3.

At time 915 of RC3 a latch signal LAT is asserted to latch a second logic state, illustrated as a low voltage level at signal DATA of FIG. 5, based upon the voltage difference between V(SNw) and V(SNe).

Figure 6:
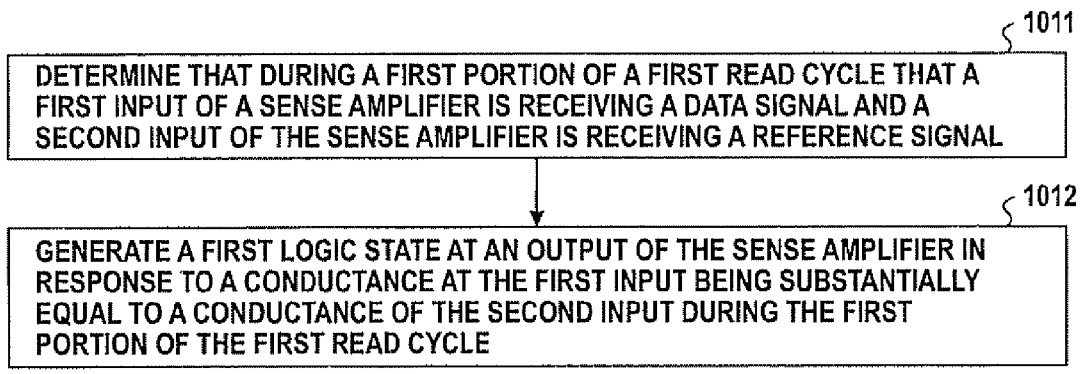
FIG. 6 illustrates a method in accordance with a specific embodiment of the present disclosure.

FIG. 6 illustrates a method in accordance with a specific embodiment of the present disclosure. At block 1011, it is determined which input of a sense amplifier is a data input to receive a data signal during a specific portion of a read cycle, such as portion 921 as previously discussed, and which input of the sense amplifier is a reference input to receive a reference signal during the first portion of the read cycle. For example, based upon specific address and control information, the decode module 18 determines which input of a sense amplifier will be connected to a global bit line that is to receive a data signal and asserts one of signal READw or signal READe in response.

At block 1012 a first logic state is generated at an output of the sense amplifier in response to a conductance at the input of the sense amplifier receiving information based upon a storage cell being read being substantially equal to the conductance at the reference input during the specific portion of the read cycle. For example, as discussed with reference to time portion 921 of the read cycle RC2 of FIG. 4, it was determined that the conductance at INw of the sense amplifier matches the conductance at INe of the sense amplifier when the voltages at these inputs are within a defined amount. Conversely, when the conductances at the sense amplifier's inputs do not match during time portion 921 neither will their respective voltages, and a second logic state, complementary to the first logic state, represented by a high-voltage data signal is generated.

The conductances at the inputs of the sense amplifier match when they are substantially equal. The conductances are considered substantially equal based upon a value defined at the sense amplifier. The defined value can be based upon charge stored at a passive storage element, such as capacitor 1437 during the amplification portion 922, as previously discussed. The charge stored at the capacitor that defines the value can be based upon a threshold voltage. For example, the charge can be obtained by setting the voltage at the capacitor based upon a threshold voltage of a transistor of the sense amplifier, and modifying this charge by an offset value. For example, the defined offset value can be based upon a second passive storage element, such as capacitor 1436 as previously discussed.

Figure 7:
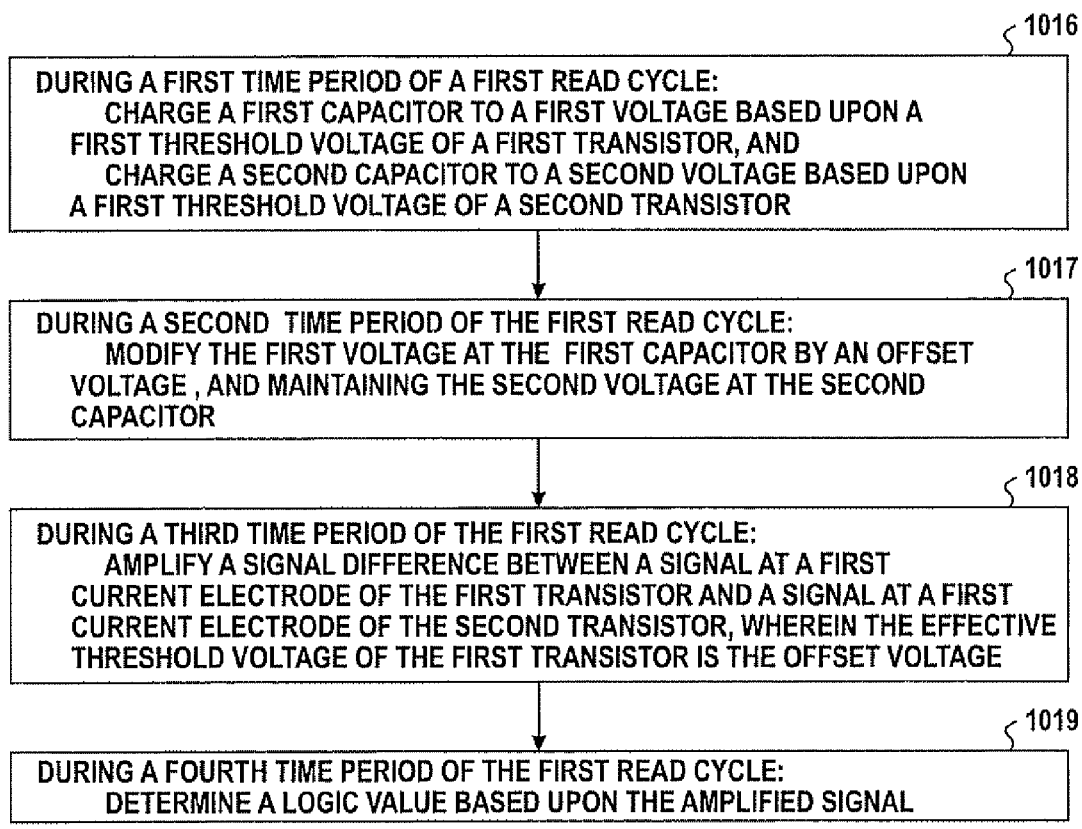
FIG. 7 illustrates a method in accordance with a specific embodiment of the present disclosure.

FIG. 7 illustrates a method in accordance with a specific embodiment of the disclosure. Block 1016 represents events associated with a portion of a read cycle, such as the time period between time 916 at the end of one read cycle and time 912 at the beginning of the next read cycle, as illustrated at FIG. 4 and FIG. 5. During this time period, a first capacitor, such as capacitor 1437, is charged based upon the threshold voltage of a first transistor of the sense amplifier, such as transistor 1445, and a second capacitor, such as capacitor 1447, is charged based upon the threshold voltage of a second transistor of the sense amplifier, such as transistor 1435.

Block 1017 represents events associated with a portion of a read cycle, such as the time period of FIG. 4 and FIG. 5 during which the signal READw is asserted. During this time period the charge at the first capacitor is modified by a defined amount, e.g., Voffset, while the voltage at the second capacitor is maintained.

Block 1018 represents events associated with a portion of a read cycle, such as the time period 922 illustrated at FIG. 4 and FIG. 5. During this time period, a signal difference between a signal at the first transistor and a signal at the second transistor is amplified based upon the first transistor having an effective threshold voltage equal to a voltage offset when the second transistor has an effective threshold voltage of zero volts.

Block 1019 represents events associated with a portion of a read cycle, such as the time period from time 916 to the end of a read cycle as illustrated at FIG. 4 and FIG. 5. During this time period a logic value based upon the amplified signal is determined.

Overall operation of a specific embodiment of memory device 10 is described with reference to FIG. 8, which illustrates sense amplifier 14, global bit line 131, global bit line 132, a portion of sub array 121 (FIG. 1), and a portion of sub array 122 (FIG. 1). The illustrated portions of sub array 121 and sub array 122 are associated with NAND string module 1311 (FIG. 9) and NAND string module 1321 (FIG. 9), respectively, as are further described herein. The illustrated portion of sub array 122 has the same elements as the illustrated portion of sub array 121. Therefore, reference numbers used to describe portions of sub array 121 have a single prime indicator for a suffix, e.g., 213', while reference numbers used to describe portions of sub array 122 that are analogous to portions of sub array 121 have a double prime indicator for a suffix, e.g., 213".

The illustrated portion of sub array 121 includes a multiplexer 271' having a data output labeled OUT, data inputs labeled 10-13, and unlabeled control inputs connected to interconnects LBSel[0 . . . 3] that provide control signals. Based upon the description herein, it will be appreciated that multiplexer 271' acts as a switch in that it can communicate signal information in either direction, i.e., from an input to output OUT during a read operation, or from output OUT to an input during a write operation. However, the operation of the memory device 10 is primarily described herein with respect reading information at a storage cell, during which the switch operates as a multiplexer, therefore, the terms "input" and "output" are used with respect to multiplexer 271' for convenience to correspond to operation of a multiplexer during a read operation.

Each input of multiplexer 271' is respectively connected to one of a corresponding plurality of local bit lines, i.e., inputs I0-I3 are connected to local bit lines LBL0'-LBL3', respectively.

Each local bit line of bit lines LBL0'-LBL3' is respectively connected to a corresponding plurality of NAND strings. However, FIG. 8 illustrates each respective local bit line respectively connected to only one of its corresponding plurality of NAND strings. For example, local bit line LBL0' is shown as connected to NAND string NS00', while other NAND strings, such as NAND string NS01', NS02', etc., that are connected to local bit line LBL0' are not illustrated. Each NAND string includes a drain side select gate, a string of NAND type storage cells, and a source side select gate. The drain side select gate of a NAND string includes a control gate connected to a corresponding interconnect labeled DSG[0], a drain electrode at the output of the NAND string, and a source electrode that is connected to the drain electrode of the storage cell at the top of the NAND string. Note that the drain electrode of the drain side select gate is labeled BL' to indicate this node is the bit line of a particular NAND string. The source side select gate of the NAND string includes a control gate connected to an interconnect labeled SSG[0], a drain electrode that is connected to the source of the storage cell that is at the bottom of the NAND string, and a source electrode. The source electrode of the source side select gate of each NAND string is connected to a reference node labeled $V_{GND}$ that provides a reference signal, such as ground, during a read cycle. The electrode that is common to the source electrode of the drain side select gate and to the drain electrode of the storage cell at the top of the NAND string is referred to herein as the "bit line of the NAND string."

Each one of the local bit lines LBL0'-LBL3' of multiplexer 271' is respectively connected to a corresponding deselect bias transistor of transistors 291'-294'. Each one of the deselect bias transistors 291'-294' respectively includes a control gate connected to a corresponding interconnect of interconnects LBSelB[0 ... 3], a drain connected to a corresponding local bit line, and a source connected to reference interconnect $V_{GND}$.

Referring to the local bit lines LBL0'-LBL3' of sub array 121: local bit line LBL0' is connected to input I0 of multiplexer 271', to the output of NAND string NS00', and to the drain of transistor 291'; local bit line LBL1' is connected to input I1 of multiplexer 271', to the output of NAND string NS10', and to the drain of transistor 292'; local bit line LBL2' is connected to input I2 of multiplexer 271', to the output of NAND string NS20', and to the drain of transistor 293'; local bit line LBL3' is connected to input I3 of multiplexer 271', to the output of NAND string NS30', and to the drain of transistor 294'.

A transistor 2721' of sub array portion 121 includes a gate connected to an interconnect labeled SELws, a source connected to the output of multiplexer 271', and a drain.

Control devices associated with the illustrated portion of sub array 121 include transistor 212', buffer 91', transistor 213', and resistive element 214'. Transistor 212' includes a gate connected to an interconnect labeled RD, a drain forming an output that connects the illustrated portion of sub array 121 to GBLw, and a source. Transistor 213' includes a gate connected to an interconnect labeled WR, a drain forming an output connected to GBLw, and a source connected to the drain of transistor 2721'. A buffer 91' includes an input connected to the drain of transistor 2721', and an output connected to the source of transistor 212'. The resistive element 214' includes a first electrode connected to an interconnect labeled $V_{PWR}$, and a second electrode connected to the drain of transistor 2721'.

A plurality of data paths that include the buffer 91 are formed at the NAND string module 121. For example, one data path includes: the node of the NAND string module that is connected to GBLw, buffer 91', transistor 2721', multiplexer 271', and NAND string NS00'. Each one of the other NAND strings of NAND string module 121 illustrated at FIG. 8 is part of another data path. For example, another data path includes: the node of the NAND string module that is connected to GBLw, buffer 91', transistor 2721', multiplexer 271', and NAND string NS10'. For each such data path, the buffer 91' is connected in series between the corresponding NAND string of the data path and the node of the NAND string module that is connected to GBLw.

Figure 8:
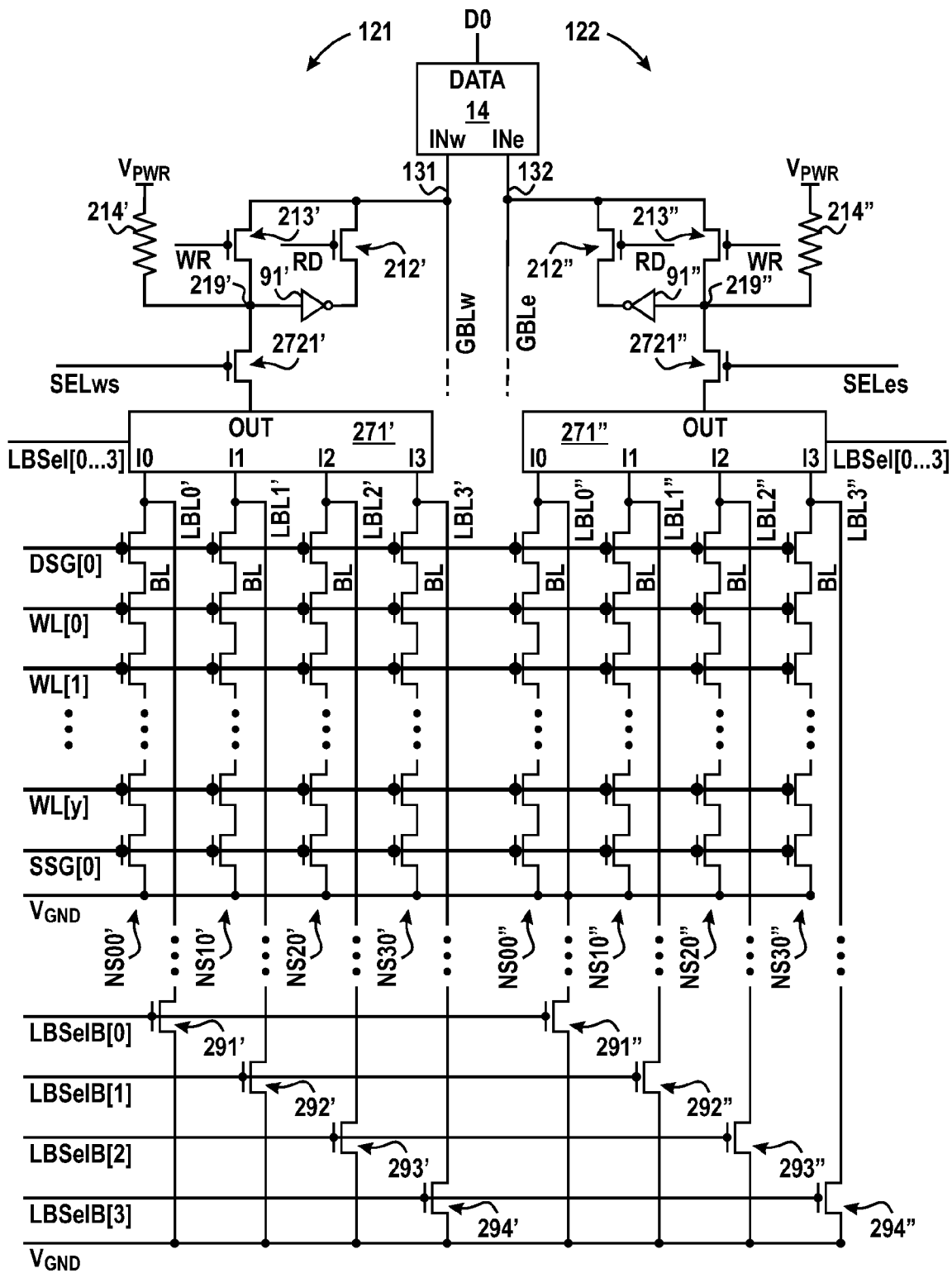
FIG. 8 illustrates a circuit diagram of a portion of the sense amplifier of FIG. 2 in accordance with a specific embodiment of the present disclosure.

As previously indicated, the portion of sub array 122 illustrated at FIG. 8 has the same elements as the illustrated portion of sub array 121. Furthermore, the elements of sub array 122 are connected to the same external interconnects as the elements of sub array 121, except for transistor 2721" of sub array 122 which has its gate electrode connected to interconnect SELes, as opposed to interconnect SELws.

The portion of memory device 10 illustrated at FIG. 8 operates as described below during a read operation of the storage cell of NAND string NS00' of sub array 121 that is connected to interconnect WL[1].

At the beginning of a read cycle, the data node at the input of buffer 91' has been biased to the reference voltage at reference node $V_{PWR}$ through resistive element 214'.

In response to address and control signals being received at the memory device 10 that indicate a the storage cell connected to interconnect WL[1] of NAND string NS00' is to be read, the following occurs: signals at interconnects DSG[0], SSG[0], WL[1], LBSel[0], LBSelB[1 ... 3], SELw, and RD are asserted; and signals at interconnects WL[0, 2 ... y], LBSel[1 ... 3], LBSelB[0], SELe, and WR are negated.

Assertion of signals at DSG[0] and SSG[0] turns on the drain side transistor and the source side transistor of each of the NAND strings illustrated at FIG. 8. As a result, the bit line BL of NAND string NS00' is conductively coupled to its corresponding local bit line LBL0', allowing signal information at BL to be communicated between the bit line of NAND string NS00' and its corresponding local bit line, LBL0'. Also, the source of the bottom storage cell of NS00' is conductively coupled to the reference interconnect $V_{GND}$.

Assertion of a signal at WL[1] provides a bias signal that allows the storage cells connected to WL[1] to be either conductive or non-conductive based upon their respective program state. Negation of signals at WL[0, 2 ... y] during a read cycle provides a bias signal that turns on each of the other storage cells of the NAND string allowing the conductivity state of the storage cell being read to be communicated to the bit line BL of the NAND string.

Assertion of the a signal at interconnect LBSel[0] allows communication of signal information between input I0 and the output OUT of multiplexer 271', while negation of the signals at interconnects LBSel[1 ... 3] prevents communication of signal information between inputs I1-I3 and the output OUT of multiplexer 271'.

Negation of a signal at interconnect LBSelB[0] turns off transistor 291', thereby electrically isolating the local bit line LBL0' from a reference signal at reference interconnect $V_{GND}$. Assertion of signals at interconnects LBSelB[1 ... 3] turns on transistors 292'-294', thereby biasing the inputs I1-I3 of multiplexer 271' to the reference signal of reference node $V_{GND}$ to prevent unnecessary leakage current through NAND strings NS10', NS20', and NS30' which are not being read.

Assertion of a signal at interconnect SELws results in the output of multiplexer 271' being communicatively coupled to the data node at the input of buffer 91', thereby allowing signal information at the output OUT, which is based upon the storage cell being read, to be communicated to the data node at the input of buffer 91'. Negation of a signal at interconnect SELes results in the output of multiplexer 271" of portion 122 being electrically isolated from the data node at the input of buffer 91", thereby preventing signal information at the output OUT of multiplexer 271" of portion 122 from be communicated to its associated data node at the input of buffer 91".

An asserted signal at interconnect RD during the read cycle results in the output of buffer 91' being communicatively coupled to the output node, which is electrically connected to the global bit line GBLw to communicate information at the output of the buffer 91' to GBLw.

Different scenarios occur at the illustrated control portion during a read operation based upon whether a storage cell is in a conductive or non-conductive state. In one scenario, when the storage cell being read is in a conductive state, current flowing through the storage cell results in charge at the data node at the input of buffer 91' being removed. For example, current at data node 219' can flow through the transistor 2721', the multiplexer 271', and the selected storage cell of NS00' to the interconnect $V_{GND}$. As a result of this current flow, the data node at the input of buffer 91' is biased to a low voltage signal, such as near ground. The low voltage signal at the data node at buffer 91' is communicated to the output of the buffer 91'. In another scenario, when the storage cell being read is in a non-conductive state, no current can flow through the storage cell of NS00 resulting in a charge at the data node at the input of buffer 91' being maintained. For example, the voltage $V_{PWR}$ at the data node at the input of buffer 91' is maintained during the read operation. The high voltage signal at the data node at the input of buffer 91' is communicated to the output of the buffer 91'.

In one embodiment, the buffer 91' is an open drain buffer, whereby a low voltage signal at its input results in the output of buffer 91' being placed at a high impedance state that prevents current flow to or from the output of portion 121, and whereby a high voltage signal at its input results in the output of buffer 91' being placed in a low impedance state allowing current to flow from its output to ground. Therefore, the output of portion 121 can be either at a high impedance state or a low impedance state based upon the program state of the storage cell being read. Note that when data is being read from portion 121 the output of portion 122 is at a low impedance state since its associated buffer 91" has a high voltage value maintained at its input.

A read signal can be asserted at interconnect RD while GBLw and GBLe are being precharged as previously discussed. During precharge, GBLw and GBLe are maintained at the precharge voltage. After precharge, the asserted read signal is maintained to allow the state information at the output of buffer 91' of portion 121 to effect the voltage at GBLw, and to allow the state information at the output of buffer 91" of portion 122 to effect the voltage at GBLe. As previously discussed, if the output of buffer 91' of portion 121 is in a low impedance state, charge will be removed from GBLw at a specific rate after precharge is completed as current flows to ground through buffer 91'. This rate is the same rate as charge is removed from GBLe of portion 122 during the same period of time. Conversely, if the output of buffer 91' of portion 121 is in a high impedance state, charge at GBLw will build at after precharge, while during the same time charge continues to be removed from GBLe. The similarity or difference in conductivity at the inputs of sense amplifier 14 can be detected as previously described.

Figure 9:
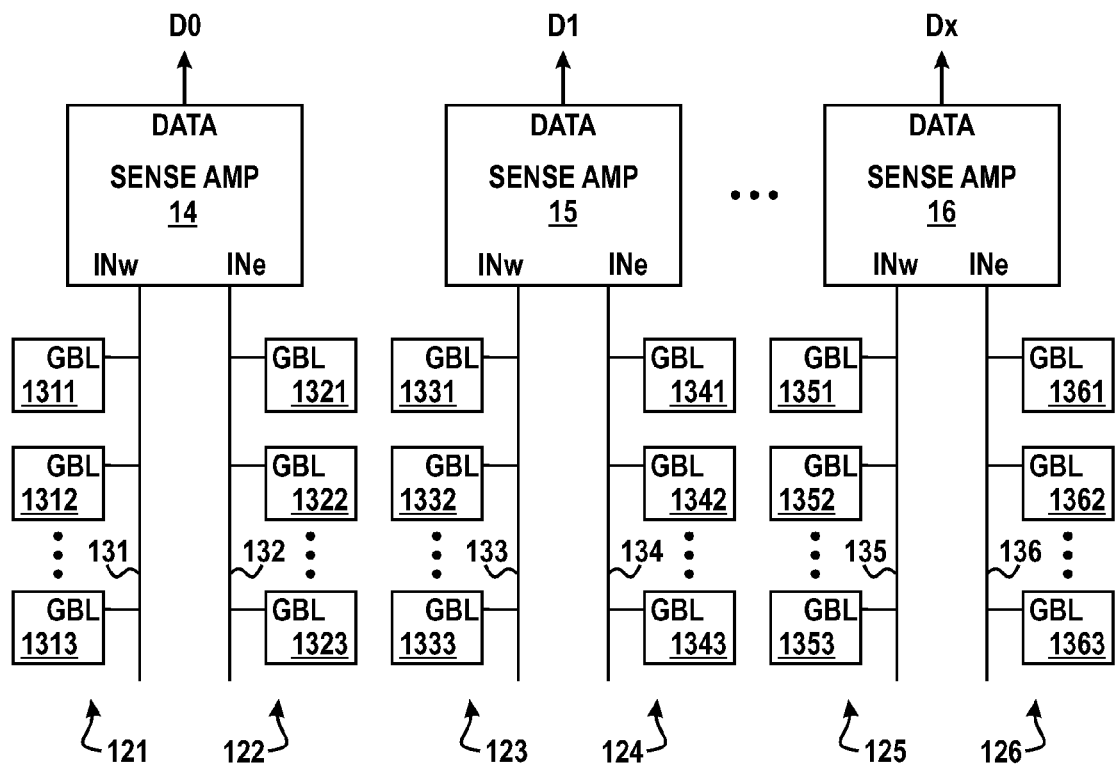
FIG. 9 illustrates NAND string modules associated with the memory device of FIG. 1 in accordance with a specific embodiment of the present disclosure.

FIGS. 9-31 describe specific embodiments of memory device 10 in accordance with the present disclosures. FIG. 9 is a block diagram that illustrates each sub array 121-126 respectively including a corresponding plurality of NAND string modules connected to its corresponding global bit line. For example: sub array 121 includes NAND string modules 1311-1313 connected to global bit line 131; sub array 122 includes NAND string modules 1321-1323 connected to global bit line 132; sub array 123 includes NAND string modules 1331-1333 connected to global bit line 1331; sub array 124 includes NAND string modules 1341-1343 connected to global bit line 134; sub array 125 includes NAND string modules 1351-1353 connected to global bit line 135; sub array 126 includes NAND string modules 1361-1363 connected to global bit line 136.

During operation, NAND string modules operate as pairs, each pair referred to as a pair of NAND string modules, to provide a data signal and a reference signal to a common sense amplifier. In one embodiment, the signals provided by the NAND string modules are characterized as being in a high-impedance state or a low impedance state that affects a charge at their global bit lines in a manner that can be detected by their corresponding sense amplifiers. With respect to the NAND string modules of FIG. 9, a pair of NAND string modules is formed by two NAND string modules connected to the same sense amplifier that have the same units digit. For example, pairs of NAND string modules associated with sub array 121 and sub array 122 include: NAND string modules 1311 and 1321; NAND string modules 1312 and 1322, and NAND string modules 1313 and 1323. For purposes of discussion, FIGS. 10-31 reference elements associated with sense amplifier 14 and the sub arrays connected to sense amplifier 14, i.e., sub arrays 121 and 122. It will be appreciated that the discussions related to sense amplifier 14 and its connected sub arrays also pertain to the other sense amplifiers and sub arrays connected thereto.

Figure 10:
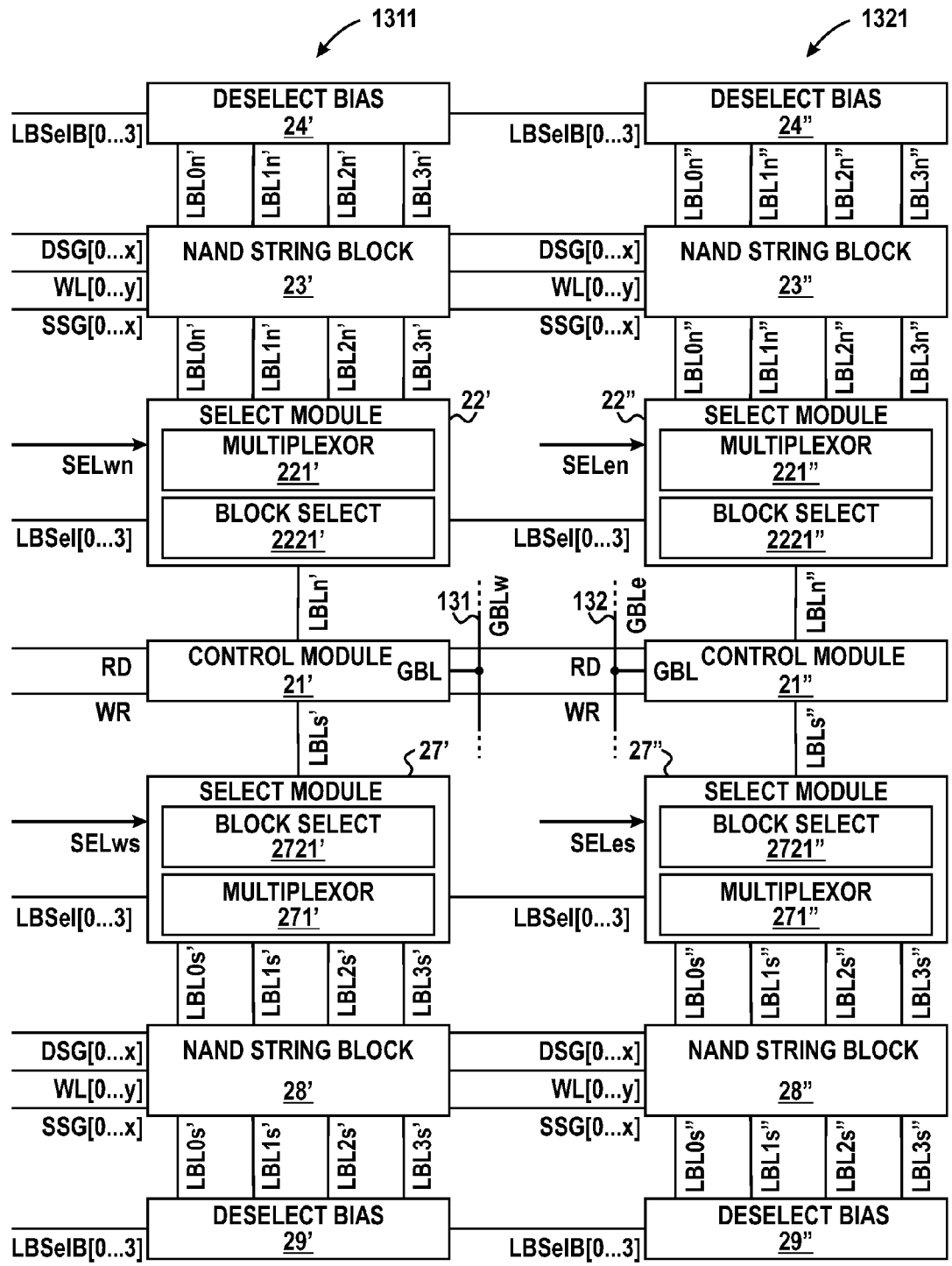
FIG. 10 illustrates a NAND string module in greater detail in accordance with a specific embodiment of the present disclosure.

FIG. 10 is a block diagram illustrating a representative pair of NAND string modules that includes NAND string module 1311 of sub array 121 and NAND string module 1321 of sub array 122, that are connected to global bit lines 131 and 132, respectively. With reference to sense amplifier 14, global bit line 131 is also referred to as GBLw and global bit line 132 is also referred to as GBLe. It will be appreciated that the discussions related to the pair of NAND string modules of FIG. 10 also pertain to the other pairs of NAND string modules of sub array 121 and sub array 122.

NAND string module 1311 is illustrated to include a deselect bias module 24', NAND string block 23', a select module 22', a control module 21', a deselect bias module 29', NAND string block 28', and a select module 27'.

Deselect bias module 24' is connected to decode module 18 (FIG. 1) via interconnects labeled LBSelB[0 . . . 3]. NAND string block 23' is connected to decode module 18 (FIG. 1) via interconnects DSG[0 . . . x], interconnects WL[0 . . . y], and interconnects SSG[0 . . . x], where "x" is an integer indicating the number of NAND string modules in each sub array 121-126 and "y" is the number of storage cells associated with each NAND string. Select module 22' is connected to decode module 18 (FIG. 1) via interconnect SELwn, and interconnects LBSel[0 . . . 3]. A plurality of interconnects labeled LBL0n'-LBL3n' connect the NAND string block 23' to the deselect bias module 24' and to the select module 22'. An interconnect labeled LBLn' connects select module 22' to the control module 21'.

Deselect bias module 29' is connected to decode module 18 (FIG. 1) via interconnects labeled LBSelB[0 . . . 3]. NAND string block 28' is connected to decode module 18 (FIG. 1) via interconnects DSG[0 . . . x], interconnects WL[0 . . . y], and interconnects SSG[0 . . . x]. Select module 27' is connected to decode module 18 (FIG. 1) via interconnect SELws, and interconnects LBSel[0 . . . 3]. A plurality of interconnects labeled LBL0s'-LBL3s' connect the NAND string block 28' to the deselect bias module 29' and to the select module 27'. An interconnect labeled LBLs' connects select module 27' to the control module 21'. In a particular layout, the control module 21', which includes buffer 91' described above, physically resides between the NAND string block 23' and the NAND string block 28'.

NAND string module 1321 is similar to NAND string module 1311. Elements of NAND string module 1321 that can be implemented in the same manner and have the same function as that described with respect to NAND string module 1321 have double prime suffix, e.g., 24", as opposed to a single prime suffix, e.g., 24'. In addition, the elements of the NAND string module 1321 are connected to the same control interconnects from decode module 18 (FIG. 1) as the elements from NAND string module 1311, with the exception of the select modules 22" and 27" of NAND string module 1321. Select module 22" of NAND string module 1321 is connected to an interconnect labeled SELen as opposed to select module 22' of NAND string module 1311 which is connected to an interconnect labeled SELwn. Select module 27" of NAND string module 1321 is connected to an interconnect labeled SELes as opposed to select module 22' of NAND string module 1311 which is connected to an interconnect labeled SELws. In the embodiment described herein only one of interconnect SELwn, SELen, SELws, and SELwn will receive an asserted signal during a specific read cycle.

Figure 11:
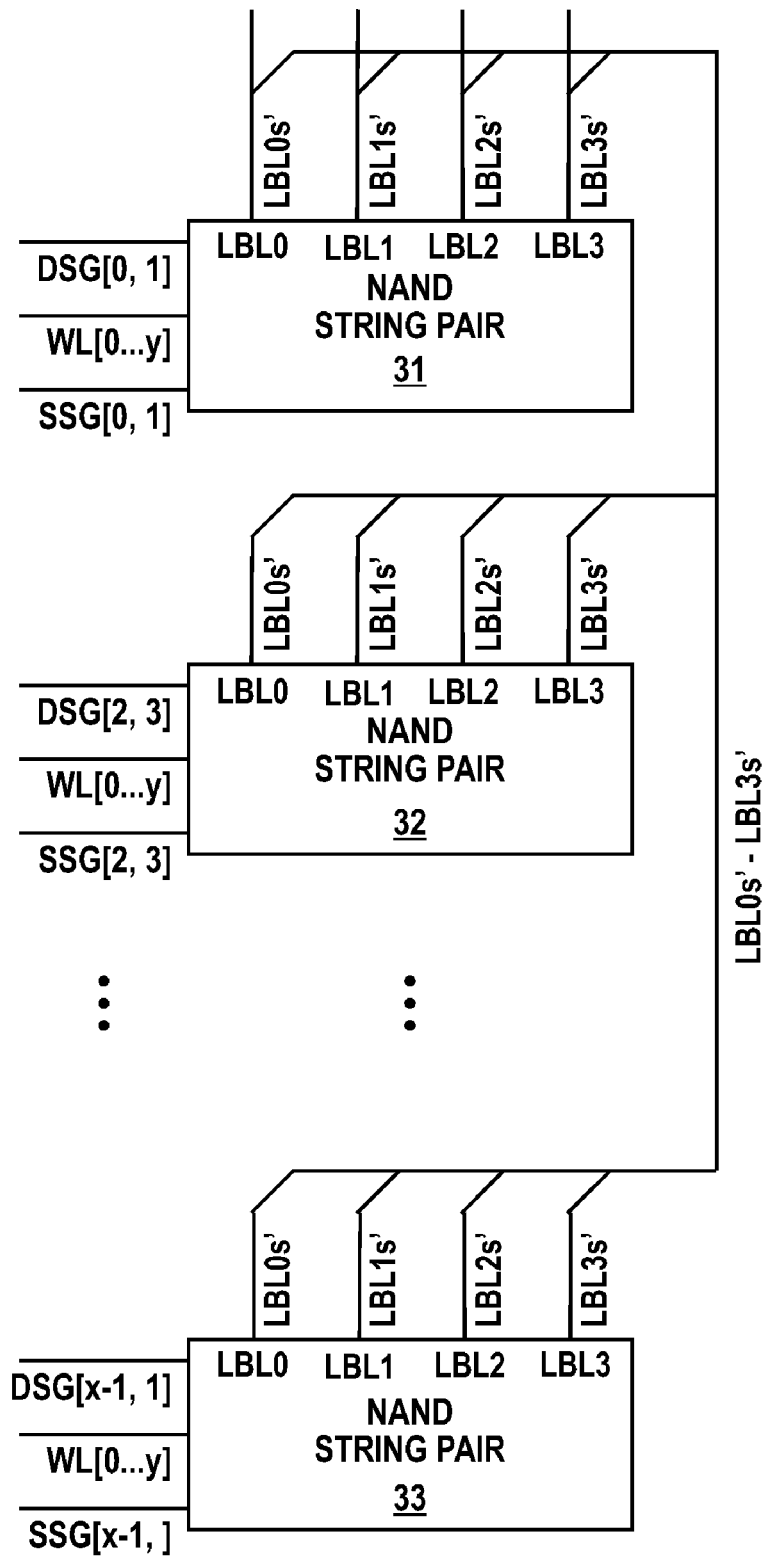
FIG. 11 illustrates a portion of FIG. 10 in greater detail in accordance with a specific embodiment of the present disclosure.

Each NAND string block of a NAND string module respectively includes a plurality of NAND string pairs. For example, FIG. 11 is a block diagram illustrating NAND string block 28', which includes NAND strings pairs 31-33. Each NAND string pair includes a corresponding two sets of NAND strings that can be mirrored so that their respective source side select gates share a common portion of an active region as described in greater detail herein. Each NAND string pair is connected to two interconnects of the interconnects DSG[0 . . . x], two interconnects of the interconnects SSG[0 . . . x], to the interconnects WL[0 . . . y], and to the interconnects LBL0s'-LBL3s'.

For example, NAND string pair 31 is connected to interconnects DSG[0,1], interconnects WL[0 . . . y], and interconnects SSG[0,1]. NAND string pair 32 is connected to interconnects DSG[2,3], interconnects WL[0 . . . y], and interconnects SSG[2,3]. NAND string pair 31 is connected to interconnects DSG[x-1,x], interconnects WL[0 . . . y], and interconnects SSG[x-1,x].

Figure 12:
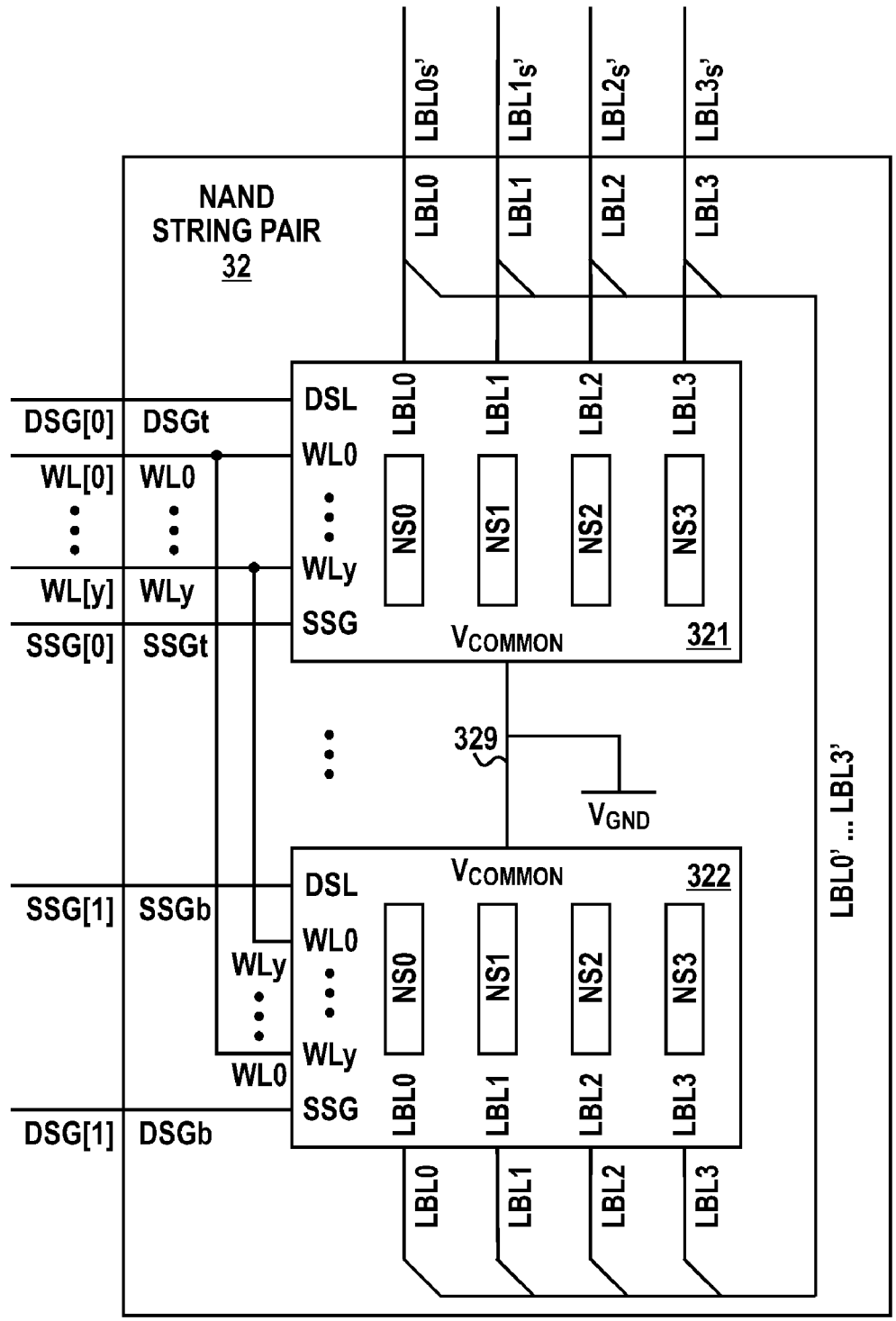
FIG. 12 illustrates a portion of FIG. 11 in greater detail in accordance with a specific embodiment of the present disclosure.

Referring to FIG. 12, NAND string pair 32 of FIG. 11 is illustrated in greater detail to include a set of NAND strings 321 and a set of NAND strings 322. Each set of NAND strings 321 and 322 is illustrated to have outputs labeled LBL0-LBL3 and a plurality of NAND strings labeled NS0-NS3 formed at adjacent columns of sub array 121. For example, the sets of NAND strings 321 and 322 of NAND string pair 32 respectively include a corresponding set of four individual NAND strings, labeled NS0-NS3, with an output of each NAND string of the set of NAND strings respectively connected (not illustrated at FIG. 12) to a corresponding output of NAND string pair 32. Referring further to FIG. 12: the output of NAND string NS0 of the set of NAND strings 321 and the output of NAND string NS0 of the set of NAND strings 322 are both connected to interconnect LBL0; NAND string NS1 of the set of NAND strings 321 and NAND string NS1 of the set of NAND strings 322 are both connected to interconnect LBL1; NAND string NS2 of the set of NAND strings 321 and NAND string NS2 of the set of NAND strings 322 are both connected to interconnect LBL2; NAND string NS3 of the set of NAND strings 321 and NAND string NS3 of the set of NAND strings 322 are both connected to interconnect LBL3. Each of the sets of NAND strings 321 and 322 are connected to a reference node 329, labeled $V_{GND}$, which can be a ground reference. It will be appreciated that the discussions related to NAND string pair 32 also describe the other NAND string pairs of the NAND string block 28' (FIG. 10).

Figure 13:
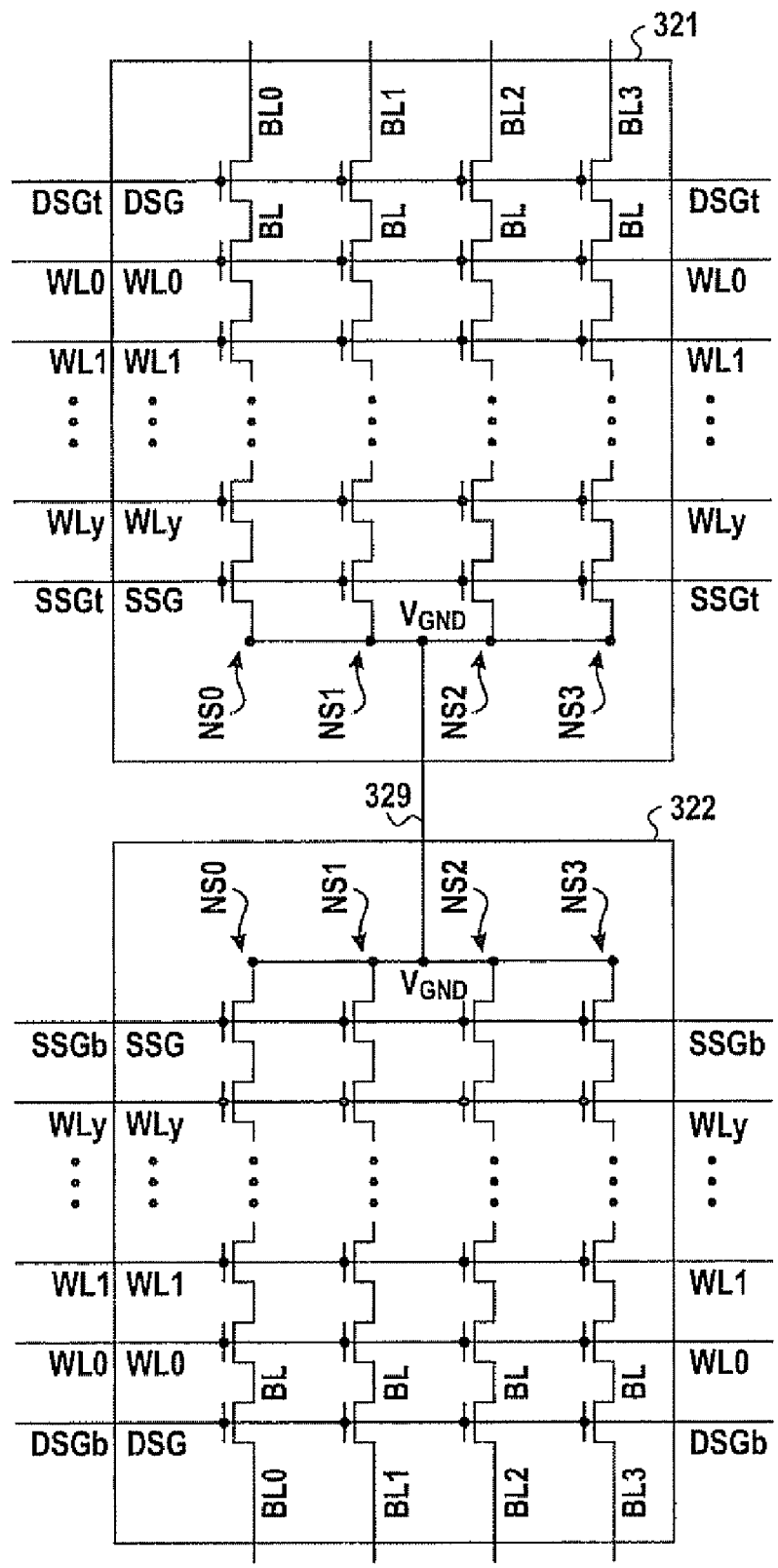
FIG. 13 illustrates the NAND strings of FIG. 12 in greater detail in accordance with a specific embodiment of the present disclosure.

FIG. 13 illustrates the connections of NAND string pair module 32 in greater detail. The NAND string pair module 32 is formed within a footprint defined by a plurality of memory array columns. Each interconnect of interconnects WL[0 . . . y] is respectively connected to a corresponding input WL0-WLy of the NAND string pair module 32. These inputs respectively correspond to the inputs of the set of NAND strings 321 and the set of NAND strings 322 having the same names. The interconnect DSG[0] (not shown) is connected to input DSGt of the NAND string pair module 32, which is connected to the input DSG of NAND string 321. The interconnect DSG[1] (not shown) is connected to input DSGb of the NAND string pair module 32, which is connected to the input DSG of NAND string 322. The interconnect SSG[0] (not shown) is connected to input SSGt of the NAND string pair module 32, which is connected to the input SSG of NAND string 321. The interconnect SSG[1] (not shown) is connected to input SSGb of the NAND string pair module 32, which is connected to the input SSG of NAND string 322. The source electrodes of each transistor connected to SSGt and SSGb are connected via a node 329.

Figure 14:
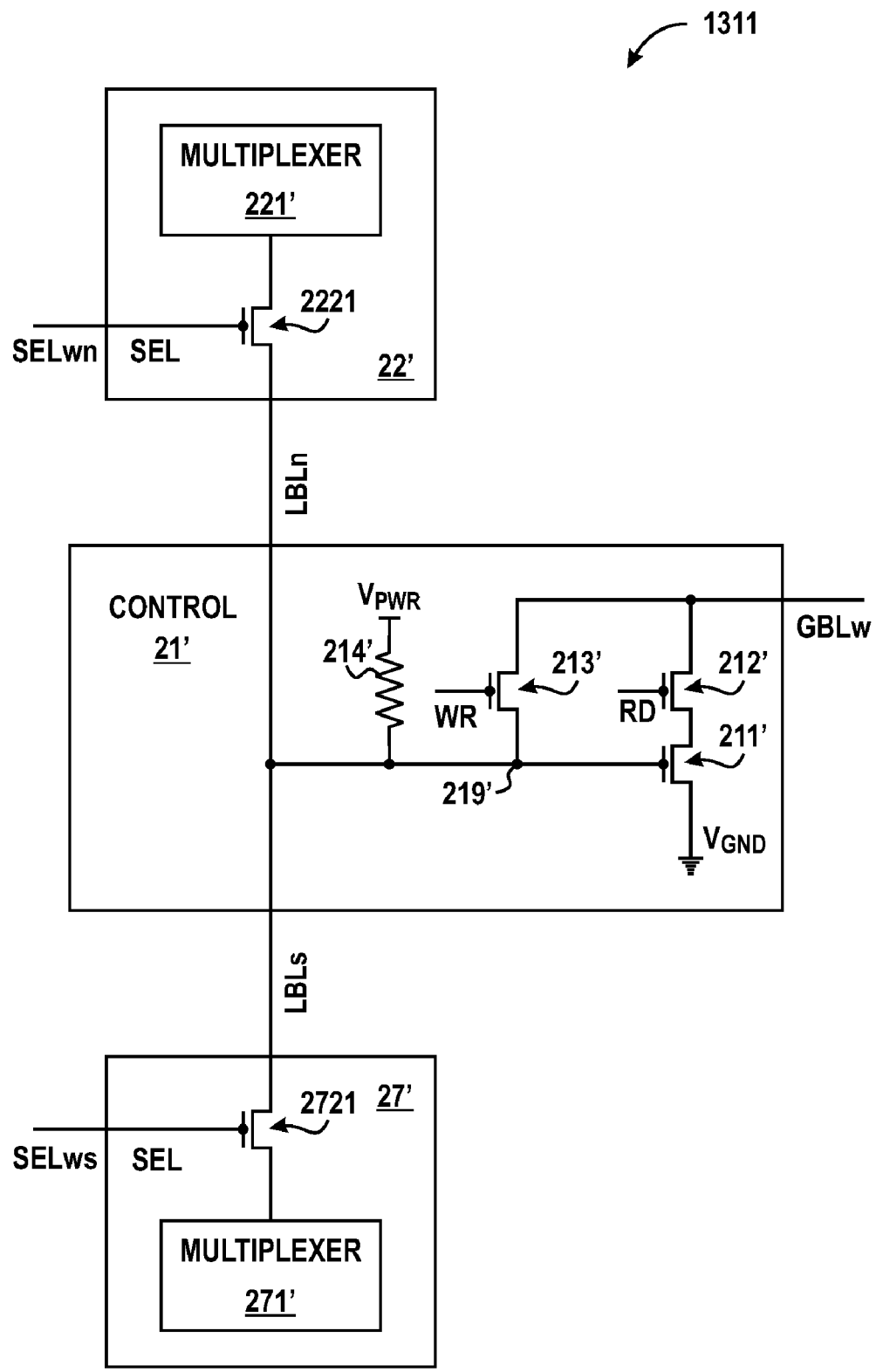
FIG. 14 illustrates a portion of FIG. 10 in greater detail in accordance with a specific embodiment of the present disclosure.

FIG. 14 illustrates portions of NAND string module 1311 (FIG. 10) in greater detail, including select module 22', select module 27', and control module 21'. As previously discussed with reference to FIG. 8, control module 21' includes transistor 212', transistor 213', and resistive element 214'. Buffer 91' of FIG. 8' is represented as transistor 211' having a control gate corresponding to the input of buffer 91', a drain electrode corresponding to the output of buffer 91', and a source connected to reference interconnect $V_{GND}$. Buffer 91', therefore, operates as an open drain buffer as previously described. The data node 219' receives conductivity information from a storage cell through either select module 22' or select module 27' when data is being access from NAND string module 1311. For example, a signal is asserted at interconnect SELwn when data is to be read from a storage cell associated with select module 22', and a signal is asserted at interconnect SELws when data is to be read from a storage cell associated with select module 27'.

Figure 15:
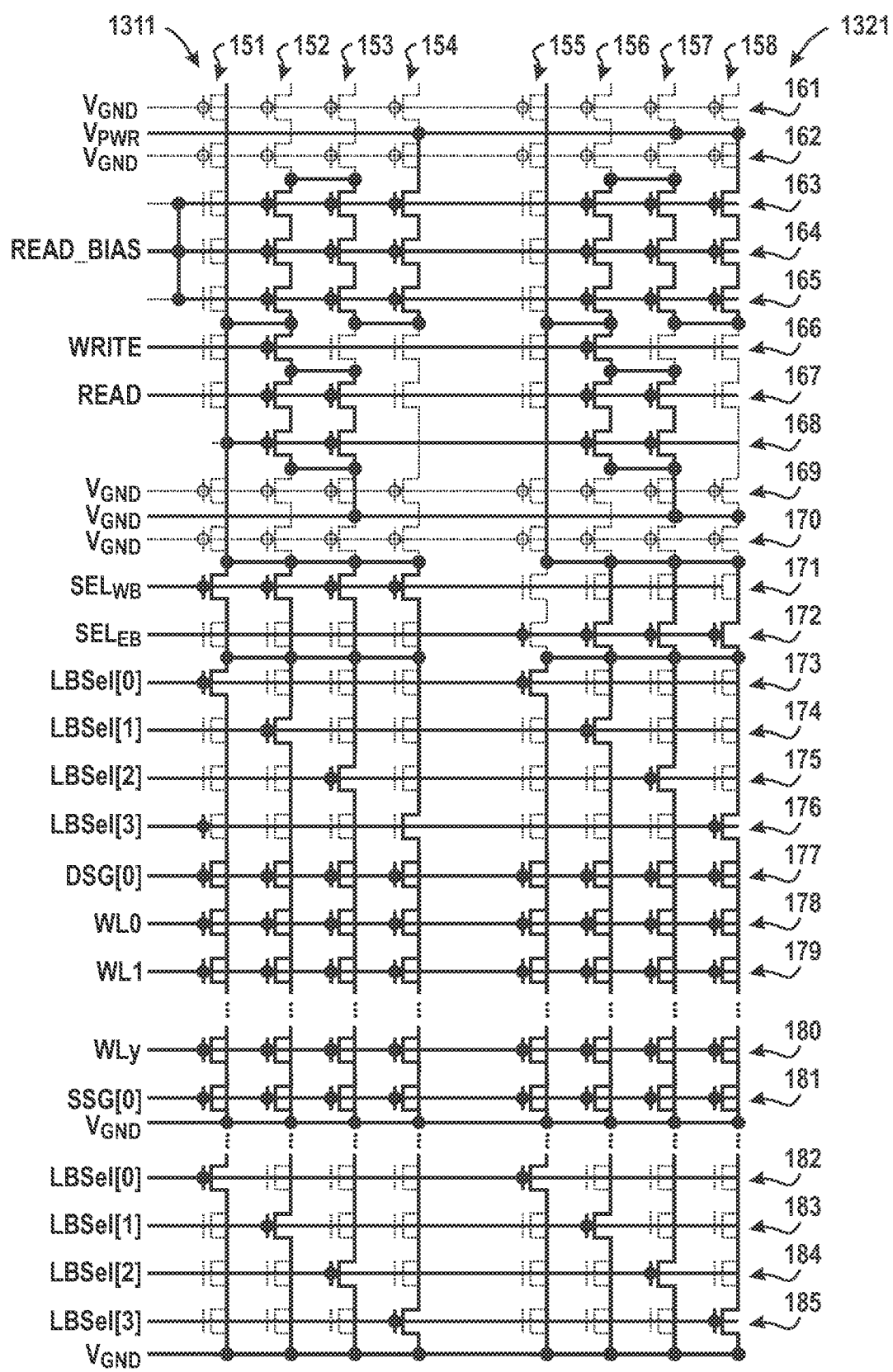
FIG. 15 illustrates a portion of a NAND string module of FIG. 10 in circuit diagram form using transistors formed at memory array columns in accordance with a specific embodiment of the present disclosure.

FIG. 15 represents a circuit diagram corresponding to portions of a pair of NAND string modules 121 and 122. For purposes of discussion, the pair of NAND string modules is assumed to be NAND string module 1311 of sub array 121 (see FIG. 9) and NAND string module 1321 of sub array 122 as previously discussed.

The circuit of FIG. 15 has been formed at memory array columns 151-154 that correspond to NAND string module 1311 of sub array 121, and at memory array columns 155-158 that correspond to NAND string module 1321 of sub array 122. Horizontal lines of FIG. 15 that intersect transistors gates represent gate electrodes. Horizontal lines that lie between transistor gate locations represent conductive interconnects, such as metal lines at a specific metal layer. Vertical lines that run through illustrated transistors represent conductive interconnects, such as metal lines at specific metal layers, that overly the transistors. For example, the solid line from the source of the transistor at column 151 and row 171 to the drain of the transistor at column 151 and line 176 represents a metal line and associated contacts. A solid dot at the gate of a transistor indicates that the transistor is used to implement a specific function associated with the NAND string module based upon a signal provided to its control gate. Transistors associated with a solid dot are illustrated using solid lines. An open dot at the gate of a transistor indicates a transistor that receives an isolating control signal, such as ground, to prevent current flow across the transistor's channel. Transistors associated with an open dot are illustrated using dashed lines that appear lighter than transistors having a solid dot at their gate. No dot at the gate of a transistor indicates that the transistor is not used to implement a function associated with the NAND string module. These transistors are typically bypassed using an overlying metal interconnect. In the discussion below, a specific transistor is referenced using its column and row number. For example, the transistor at column 154 and row 173 can be referred to herein as transistor 154/173.

With respect to NAND string module 1311, control module 21' (FIG. 10) is formed from transistors at rows 163-168 of columns 151-154. Transistors at rows 162 and 169 are connected to an interconnect that receives a negated signal during data access operations to prevent current flow through their channel regions, thereby electrically isolating portions of the active region within a column from one another. Elements of control module 21' correspond to elements of FIG. 14 as follows: transistor 211' corresponds to transistor 152/168 and transistor 153/168, which are connected in parallel; transistor 212', corresponds to transistor 152/167 and transistor 153/167, which are connected in parallel; transistor 213' corresponds to transistor 152/166; resistive element 214' is formed by a block of nine transistors connected in series, where the transistors are common to columns 152-154 and rows 163-165.

With respect to NAND string module 1311, select module 27' of FIG. 14 is formed from transistors at rows 171-176 of columns 151-154. The transistor 2721' corresponds to four transistors: transistor 151/171, transistor 152/171, transistor 153/171, and transistors 154/171. The multiplexer 271' corresponds to four transistors: transistor 151/176, transistor 152/175, transistor 153/174, and transistor 152/173.

With respect to NAND string module 1311, the NAND string block 28' as illustrated at FIG. 10, is formed from transistors at rows 177-181 of columns 151-154. For example, NAND string NS0' corresponds to the following transistors: transistor 151/177 is the drain side select transistor; transistors 151/178-180 are storage cells of the NAND string; and transistor 151/181 is the source side select transistor. It will be appreciated that additional NAND strings that are not illustrated at FIG. 15 are formed at column portions between row 181 and row 182.

With respect to NAND string module 1311, the de-select bias module 29', as illustrated at FIG. 10, is formed from transistors at rows 182-185 of columns 151-154. Referring to FIG. 8, transistor 291' corresponds to transistor 151/185. Transistor 292' corresponds to transistor 152/184. Transistor 293' corresponds to transistor 153/183. Transistor 294' corresponds to transistor 154/182.

The transistors of columns 155-158 are associated with NAND string module 1321, and are connected in the same manner as discussed with respect to the transistors of columns 151-154 of NAND string module 1311, except that the transistor 2721' of NAND string module 1321 (FIG. 8) corresponds to transistor 155/172, transistor 156/172, transistor 157/172, and transistor 158/172.

It will be appreciated that FIG. 15 only illustrates the control module 21' of FIG. 8. and those portions below control module 21' of NAND string module 1311 as illustrated at FIG. 8, and that portions of NAND string module 1311 above control portion 21' at FIG. 15 can be implemented by mirroring the circuit at columns 151-154, whereby the mirrored circuit would be connected to the data node 219'.

FIGS. 16-20 illustrate in physical stick layout form key features of a process flow used to form the elements of the NAND string modules that make up the memory array 12 from transistors formed at the active region of various columns. The column and row numbers of FIG. 15 have been maintained to correlate transistors of FIG. 15 to corresponding transistor locations of FIGS. 16-20. Therefore, transistors at column 151 of FIG. 15 include a portion of the active region of column 151 as illustrated at FIGS. 16-20.

Figure 16:
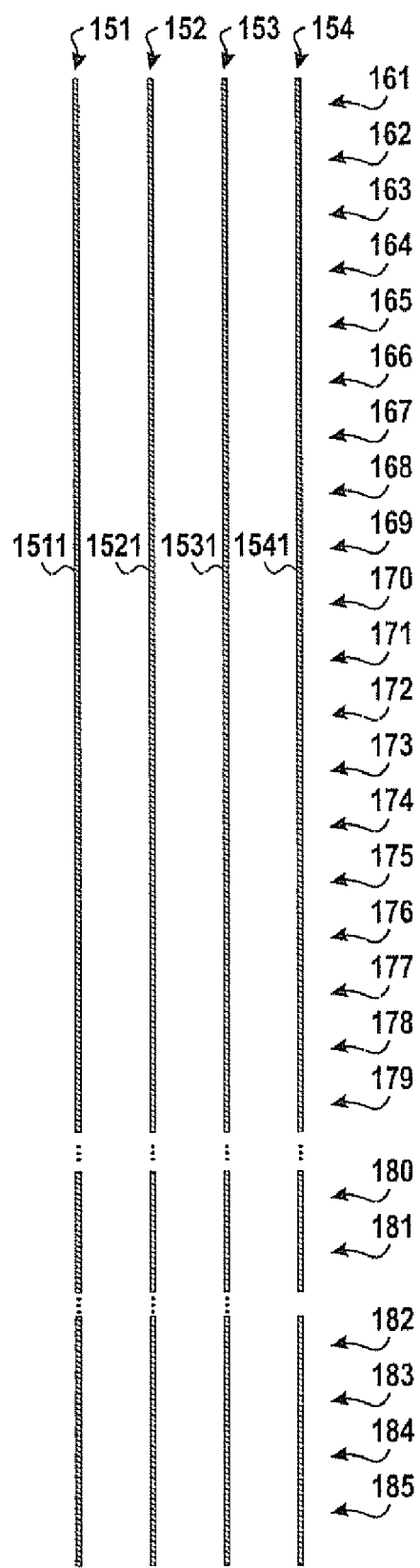
FIGS. 16-20 illustrate physical layers in stick diagram form of the circuit diagram of FIG. 15 in accordance with a specific embodiment of the present disclosure.
Figure 24:
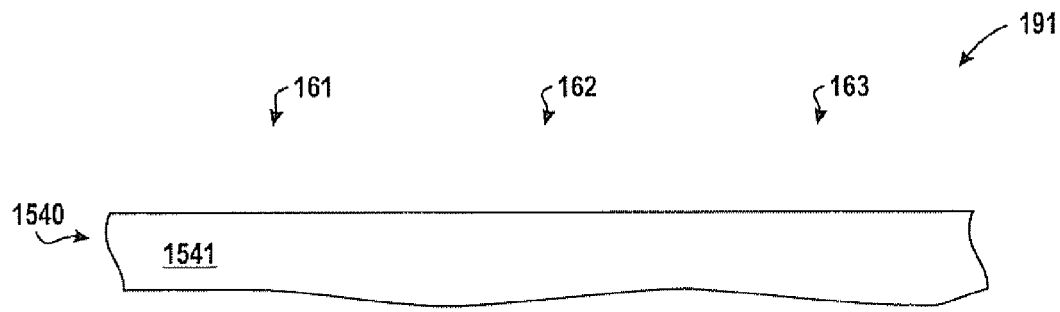
FIGS. 24-29 illustrates cross sectional views corresponding to various locations of FIGS. 16-20.
Figure 25:
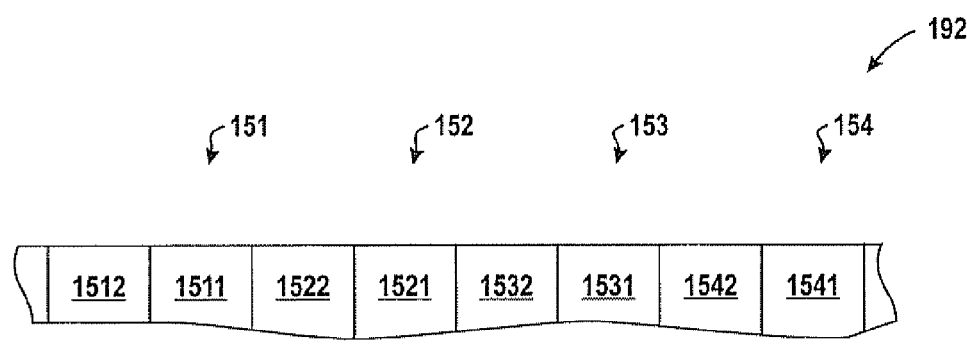

FIG. 16 illustrates active regions formed at columns 151-154 of memory array 12, whereby sequentially numbered columns are immediately adjacent to each other. The pitch of each of the columns 151-154 can be the same, or vary periodically. Similarly, the pitch of columns 155-158 can be the same or vary periodically. Each column of the memory array 12 has a length, though FIG. 16 illustrates only a portion of the length of a column that includes those portions of the NAND string module 1311 illustrated at FIG. 15. Each column of the columns 151-154 respectively includes a corresponding active region that extends the length of the sub array 121. Each NAND string module connected to the corresponding global bit line 131 of sub array 121, including NAND string module 1311, is formed at the columns 151-154. With respect to an active region, from a top view, the active region has a length dimension extending in one direction and a width dimension extending in a another dimension, wherein the width dimension is the same as or less than the length dimension and is orthogonal to an edge of the active region. In one embodiment a width of the active region can be approximately 45 nm and the column pitch of the active region can be approximately 90 nm. FIG. 24 illustrates a cross sectional view along a column length dimension of FIG. 16 at a location that includes the active region 1540 of column 154 that comprises a P-doped material 1541. FIG. 25 illustrates a cross sectional view along a column width dimension of FIG. 16 at a location between rows 165 and 166 that illustrates active regions portions 1511, 1521, 1531, and 1541 isolated from each other by isolation regions 1512, 1522, 1532, and 1542 of columns 151-154.

Figure 17:
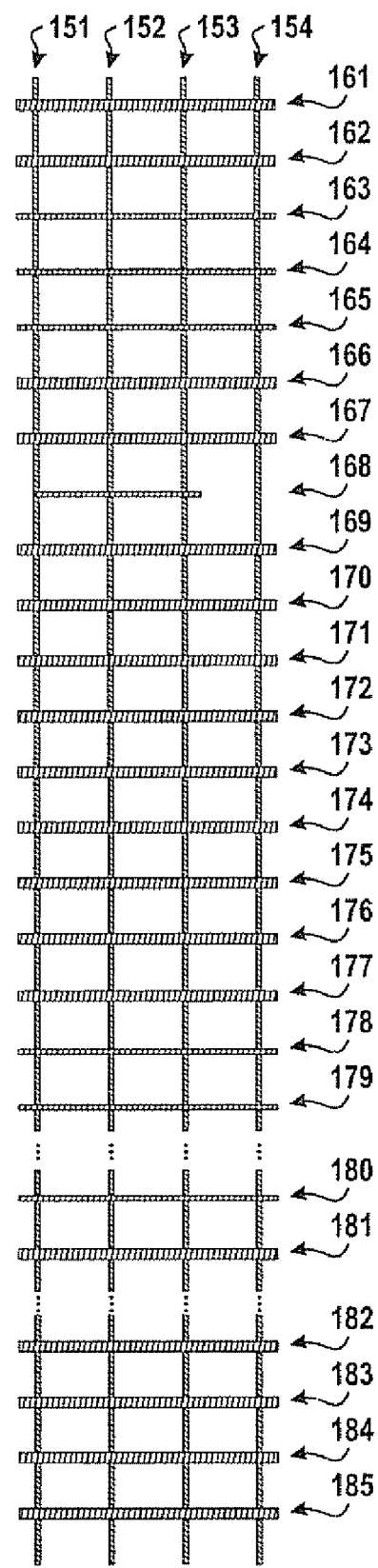
Figure 26:
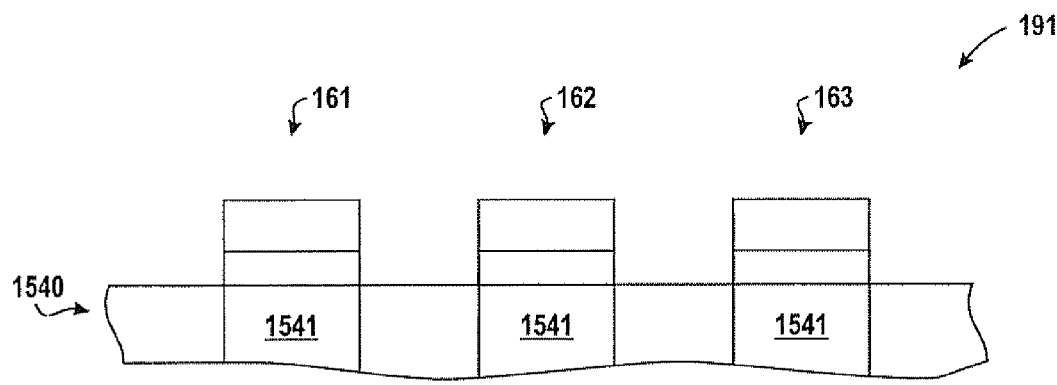

At FIG. 17, gate structures have been formed overlying the active regions where transistors are to be formed at each of the rows 161-185. It will be appreciated that not all gate structures illustrated at FIG. 17 need to be formed using the same process, even though the transistors being formed by the illustrated gate structures, whether storage cells or switches, are formed at different portions of the same columns. For example, the transistors at rows 178-180 that form storage cells can be formed can be formed using a different process than the transistors that perform a switching function, such as the transistors at row 177. The gate structures associated with control functions are illustrated to be wider than gate structures associated with storage cells and resistive element 214. FIG. 26 illustrates the cross sectional view at the same location as FIG. 24 after formation of the gate structures, which are illustrated to include a gate dielectric between a channel region and a conductive portion.

Figure 18:
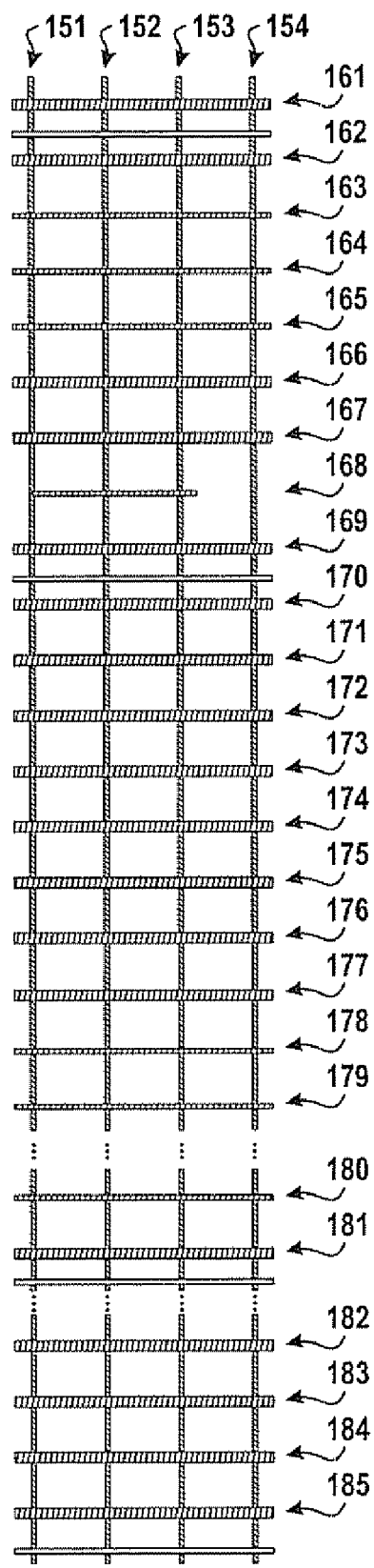
Figure 27:
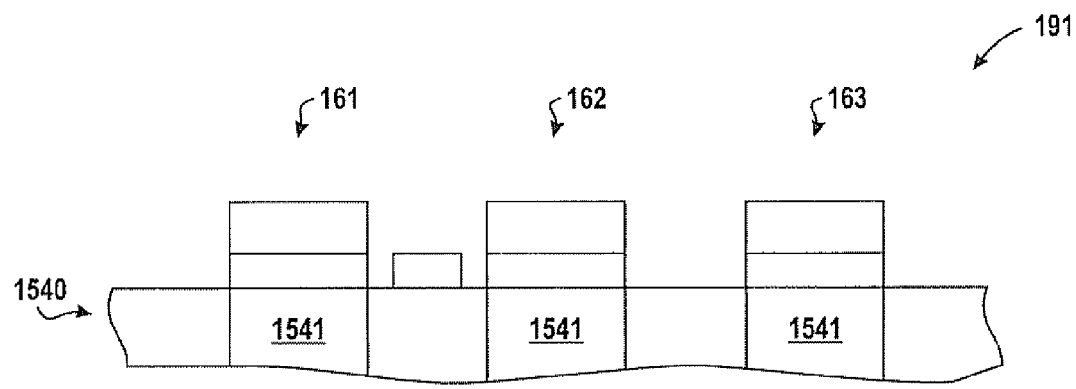

At FIG. 18, respective conductive regions have been formed just below corresponding rows 161, 169, 181, and 185 to electrically connect portions of active regions together. For example, the conductive regions can be metal interconnects, such as an interconnect including aluminum, copper, tungsten, or the like. FIG. 27 illustrates the cross sectional view at the same location as FIG. 24 after formation of the metal interconnects.

Figure 19:
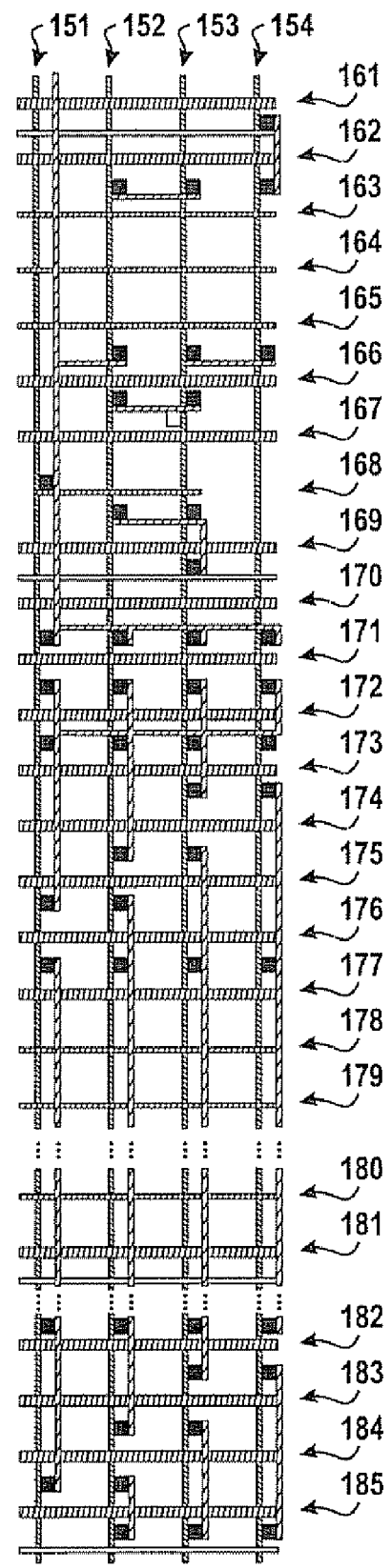

At FIG. 19, conductive contacts and interconnect regions, e.g., metal lines, have been formed overlying the conductive gate layer to connect transistors as described at FIG. 15. Vertical portions of conductive interconnect regions formed at FIG. 19 are illustrated as being offset from the active regions formed at FIG. 16 for purposes of illustration. Typically, the vertical portions of conductive interconnect regions formed at FIG. 19 will directly overly the active regions. The conductive interconnect regions can be any conductive material suitable for the purposes described herein. For example, the conductive regions formed at FIG. 19 can be metal interconnects, such as an interconnect including aluminum, copper, tungsten, or the like. A contact illustrated at FIG. 19 connects together those features that it abuts. For example, the contact between row 161 and row 162 connects a horizontal conductive line between row 161 and row 162 to the conductive interconnect of column 154 that overlies the gate structure at row 162. Note that this contact also connects the underlying active region shared by transistors 154/161 and 154/162, even though this connection to the shared active region has no operational effect in that the neighboring transistors are not active during normal operation. The contact at column 154 between rows 162 and 163 connects the active region shared by transistors 154/162 and 154/163 to the conductive interconnect of column 154 that overlies the gate structure of row 162. The contact abutting the gate electrode at row 168 connects the gate structure of row 168 to the overlying vertical conductive interconnect formed at FIG. 19. Note that this contact also connects the underlying active region shared by transistors 151/167 and 151/169, even though this connection has no operational effect. Note that in an alternate embodiment, the gate at row 168 can extend over the active region of column 151, thereby forming a transistor, with no adverse effects so long as the gate at row 168 and the overlying metal line are electrically connected by the contact.

Figure 28:
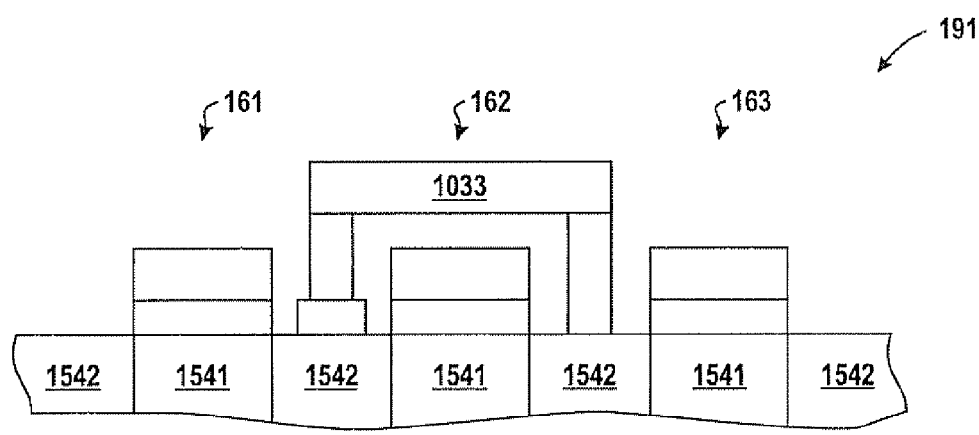
Figure 29:
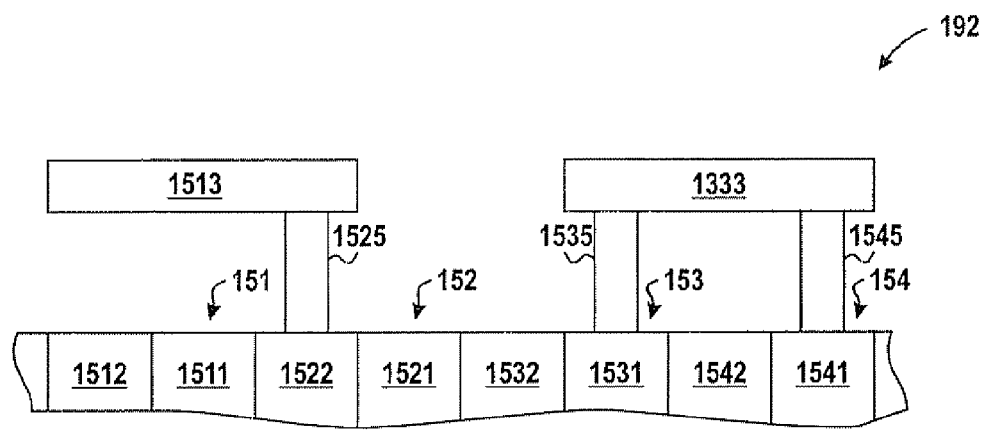

FIG. 28 illustrates the cross sectional view at the same location as FIG. 24 after formation of the metal interconnects and contacts, and FIG. 29 illustrates the cross sectional view at the same location as FIG. 25 after formation of the metal interconnects and contacts.

Figure 20:
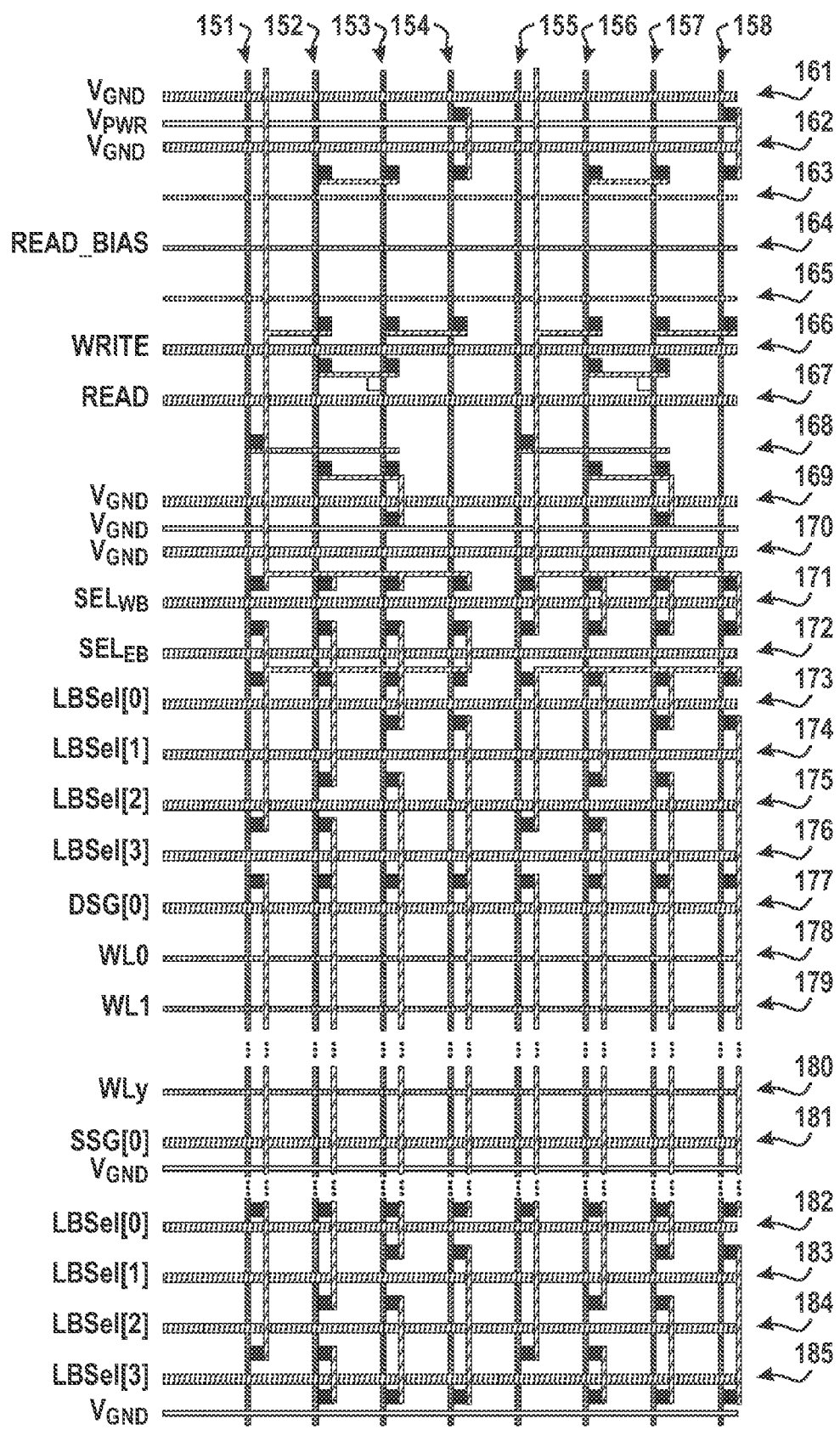

FIG. 20 illustrates the NAND string module features of columns 151-158, as described with reference to the NAND string modules 1311 and 1321 of FIG. 15, in stick layout form.

Figure 21:
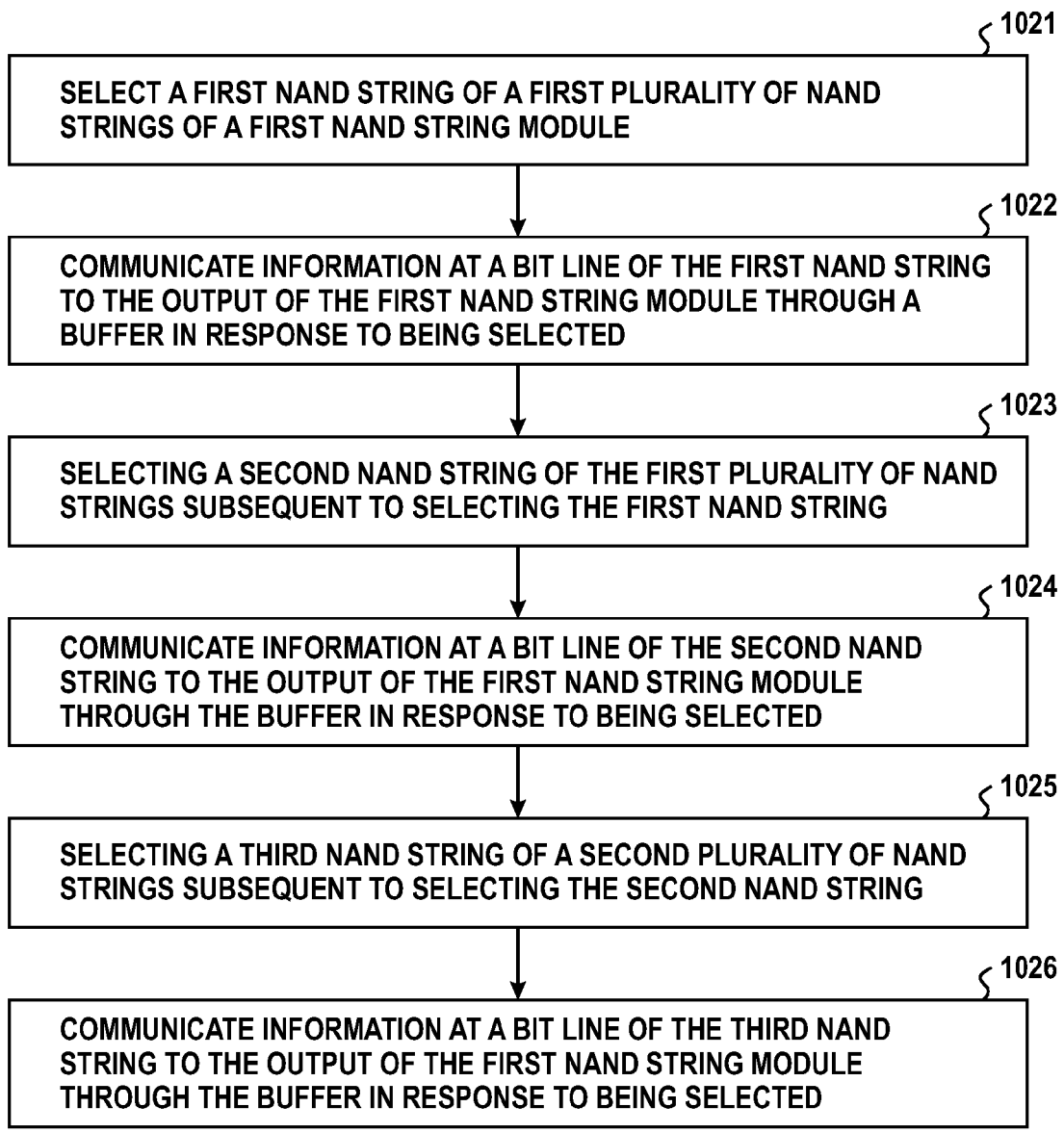
FIG. 21 illustrates a method in accordance with a specific embodiment of the present disclosure.

FIG. 21 illustrates a method in accordance with a specific embodiment of the present disclosure. At block 1021, a first NAND string of a first plurality of NAND strings of a NAND string module is selected. For example, in the specific embodiments previously discussed, any one of the NAND strings associated with NAND string module 1311 can be selected by the decode module 18 (FIG. 1) during a read operation.

At block 1022, information at a bit line of the first NAND string is communicated to the output of the first NAND string module through a buffer in response to the first NAND string being selected. For example, as illustrated at FIG. 8, information at a bit line, BL, of NAND string NS00' can be communicated to global bit line 131, GBLw, through buffer 91' of the NAND string module 1311 in response to a storage cell of NAND string NS00 being selected during a read operation.

At block 1023, a second NAND string of the first plurality of NAND strings of the NAND string module is selected. For example, in the specific embodiment previously discussed, any other NAND string associated with the NAND string module 1311 can be selected by the decode module 18 (FIG. 1) during a read or write operation. The first and second NAND string can be in the same NAND string block, i.e., both NAND string block 28', or in different NAND string blocks, i.e., one in NAND string block 23' and the other in NAND string block 28'.

At block 1024, information at a bit line of the second NAND string is communicated to the output of the first NAND string module through the buffer in response to being selected. For example, a specific embodiment previously described indicates that information from each NAND string of a NAND string module is communicated to the output of the NAND string module through the same buffer for all read operations. It will be appreciated that information from all NAND strings associated with NAND string module 1311 is communicated to the output of the NAND string module through buffer 91'.

At block 1025, a third NAND string of the second plurality of NAND strings of the NAND string module is selected. For example, in the specific embodiment previously discussed, the first NAND string and the second NAND string are associated with NAND string block 28' and the third NAND string is associated with NAND string block 23'.

At block 1026, information at a bit line of the third NAND string is communicated to the output of the first NAND string module through the buffer in response to being selected. For example, a specific embodiment previously described indicates that information from each NAND string of a NAND string module is communicated to the output of the NAND string module through the same buffer for all read operations.

Figure 22:
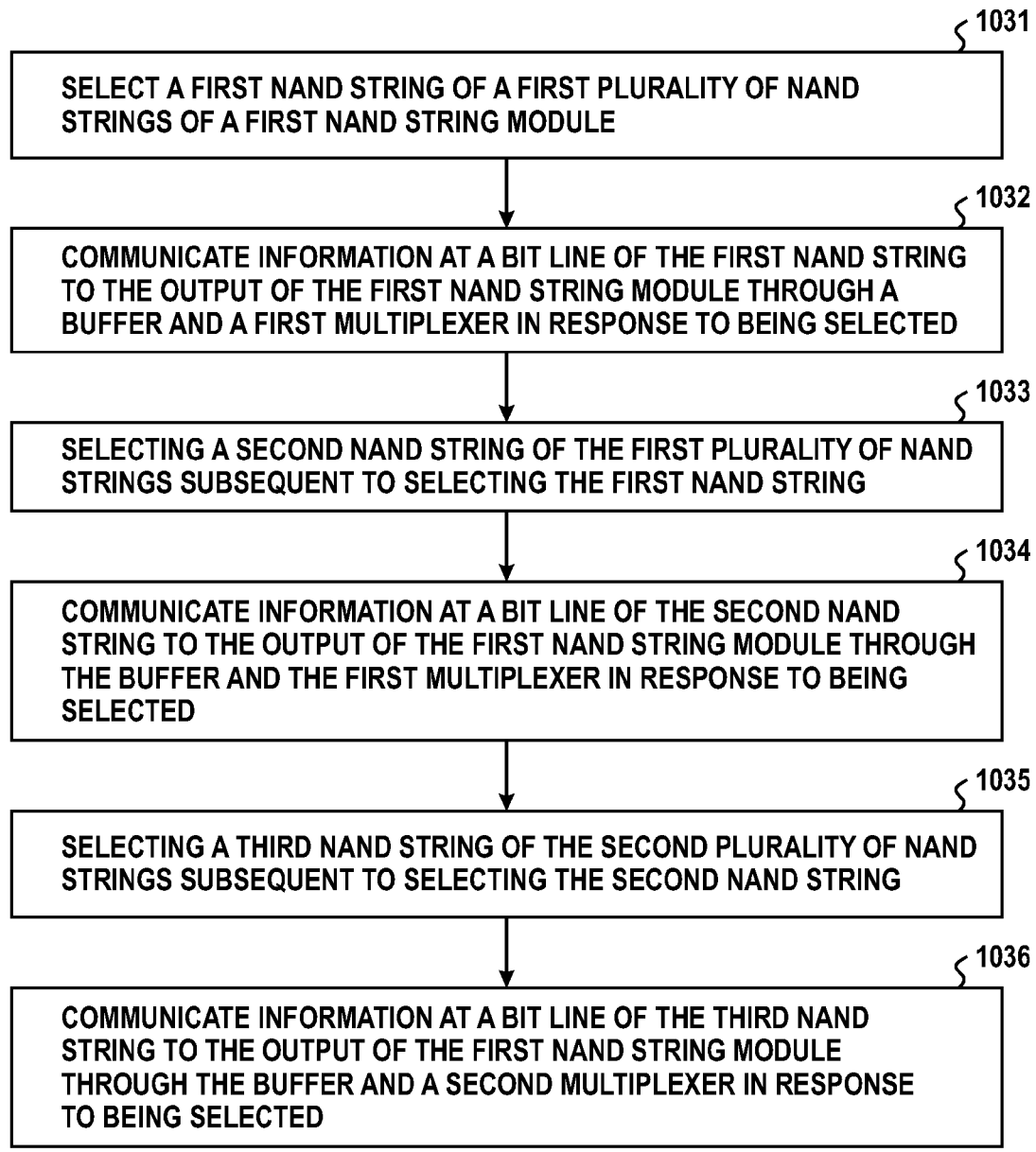
FIG. 22 illustrates a method in accordance with a specific embodiment of the present disclosure.

FIG. 22 illustrates a method in accordance with a specific embodiment of the present disclosure. Block 1031 corresponds to block 1021 of FIG. 21 as previously discussed subject to other limitations of the method of FIG. 22.

At block 1032, a bit line of the first NAND string is electrically connected to the output of the first NAND string module through a buffer and a first multiplexer in response to being selected. For example, as illustrated at FIG. 8, a bit line BL of a NAND string module at sub array 121 can be selected to communicate information to global bit line 131 through buffer 91' and through multiplexer 271' to the output of the NAND string module in response to being selected during a read operation.

Block 1033 corresponds to block 1023 of FIG. 21 as previously discussed subject to other limitations of the method of FIG. 22.

At block 1034, information at a bit line of the second NAND string is communicated to the output of the first NAND string module through the buffer and the first multiplexer in response to being selected. For example, information at two NAND strings associated with the same NAND string block, such as NAND string block 28', will be communicated to the output of the NAND string module through the same buffer and multiplexer, such as local bit line select module 271', for all read operations.

At block 1035, a third NAND string of a second plurality of NAND strings of the NAND string module is selected subject to other limitations of the method of FIG. 22.

At block 1036, information at a bit line of the third NAND string is communicated to the output of the first NAND string module through the buffer and a second multiplexer in response to being selected. For example, information at two NAND strings associated with the two different NAND string blocks, such as NAND string block 23' and NAND string block 28', will be communicated to the output of the NAND string module through the same buffer and different multiplexers during their respective read operations.

Figure 23:
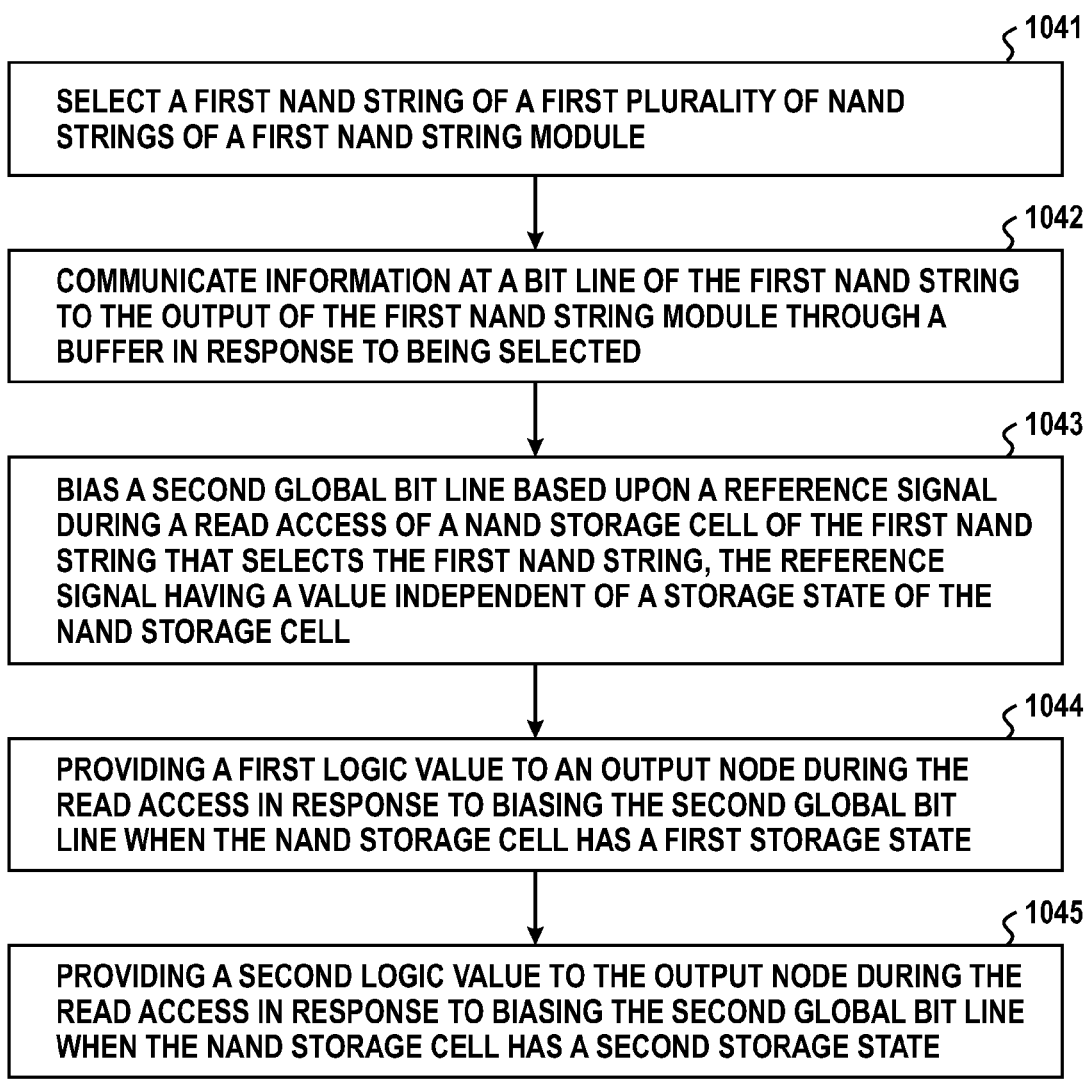
FIG. 23 illustrates a method in accordance with a specific embodiment of the present disclosure.

FIG. 23 illustrates a flow diagram of a method according to a specific embodiment of the present disclosure. At block 1041, a first NAND string of a first plurality of NAND strings is selected. For example, in the specific embodiment previously discussed, any one of the NAND strings associated with NAND string module 1311 can be selected by the decode module 18 during a read or write operation.

At block 1042, information at a bit line of the first NAND string is communicated to the output of the first NAND string module, which is electrically connected to a first global bit line, e.g., GBLw, through a buffer in response to being selected during a read operation. For example, as illustrated at FIG. 8, a bit line BL of a NAND string, such as NAND string NS00, can be selected to communicate information to global bit line 131 through buffer 91 to the output node of the NAND string module in response to being selected during a read access of a NAND storage cell of the first NAND string.

At block 1043, a second global bit line, e.g., GBLe, is biased based upon a reference signal, e.g., Vref, in response to the read operation of the first NAND string.

At block 1044, a first logic value is provided to an output node, such as to the output node DATA of a sense amplifier, in response to biasing the second global bit line when a storage cell being read is at a non-conductive state. For example, when the second global bit line is biased based upon Vref when a storage cell being read is non-conductive, the sense amplifier will apply a first logic value.

At block 1045, a second logic value is provided to an output node, such as to the output node DATA of a sense amplifier, in response to biasing the second global bit line when a storage cell being read is in a conductive state. For example, when the second global bit line is biased based upon Vref when a storage cell being read is conductive, the sense amplifier will apply a second logic value.

In the foregoing specification, various benefits and advantages have been described with reference to specific embodiments. However, one of ordinary skill in the art would appreciate that various modifications and changes can be made without departing from the scope of the present invention, as set forth in the claims. Accordingly, the specification and figures are to be regarded in an illustrative rather than a restrictive sense, and all such modifications are intended to be included within the scope of the present disclosure.

Figure 30:
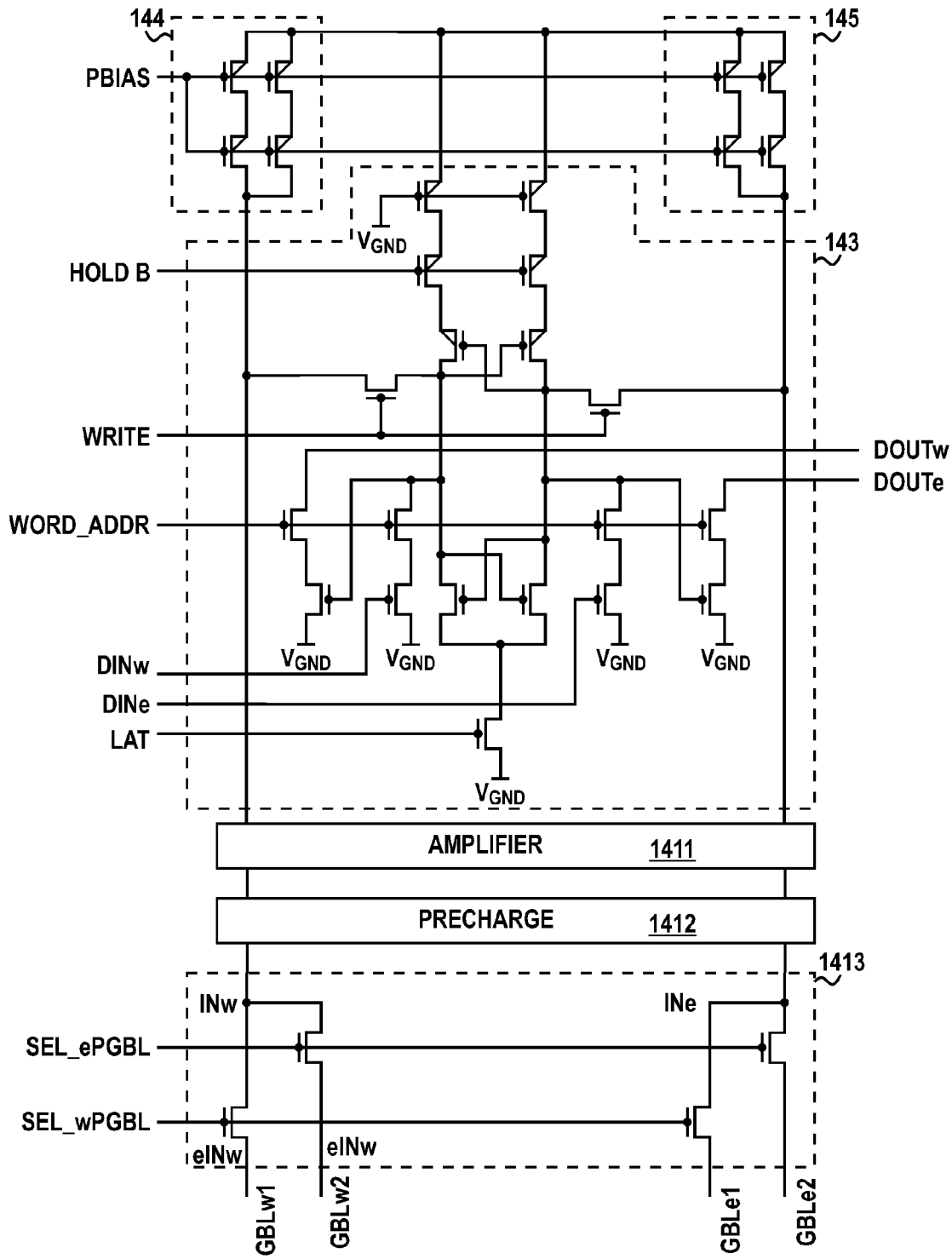
FIG. 30 illustrates a sense amplifier in accordance with a specific embodiment of the present disclosure.

For example, each of the sense amplifiers described above have been associated with a single pair of inputs. It will be appreciated however, that each sense amplifier can be associated with 2 or more pairs of sense amplifiers. For example, FIG. 30 illustrates an alternate embodiment of a sense amplifier that is connected to two pairs of global bit lines. Amplifier 1411 and pre-charge module 1412 of FIG. 30 are the same as previously described at FIG. 3. A module 1413 selects one of two pairs of global bit lines to be sensed during a read cycle. A signal is asserted at interconnect SEL_wPGBL is asserted to select global bit lines GBLw1 and GBLe1. A signal is asserted at interconnect SEL_ePGBL is asserted to select global bit lines GBLw2 and GBLe2.

A specific implementation of Latch 143 is illustrated at FIG. 30. The latch 143 is formed by six PFETs, illustrated with a diagonal indicator at their respective sources, and thirteen NFETs. During a write mode data is received at interconnect DINw that is to be written to a storage cell associated with the global bit line connected to input INw, and data is received at interconnect DINe that is to be written to a storage cell associated with the global bit line connected to input INe. During a read mode data read from a storage cell associated with the global bit line connected to input INw is provided to interconnect DINw, and data read from a storage cell associated with the global bit line connected to input INe is provided to interconnect DINe. The signal HOLDB is asserted to provide power to the latching transistors. Signal WORD_ADDR connects the output of the latch to an output data bus.

A specific implementation of the current sources 144 and 145 are illustrated as being formed from PFETs. The transistors used to form the PFETS of current sources 144 and 145 can be interleaved in a layout to ensure matching.

Figure 31:
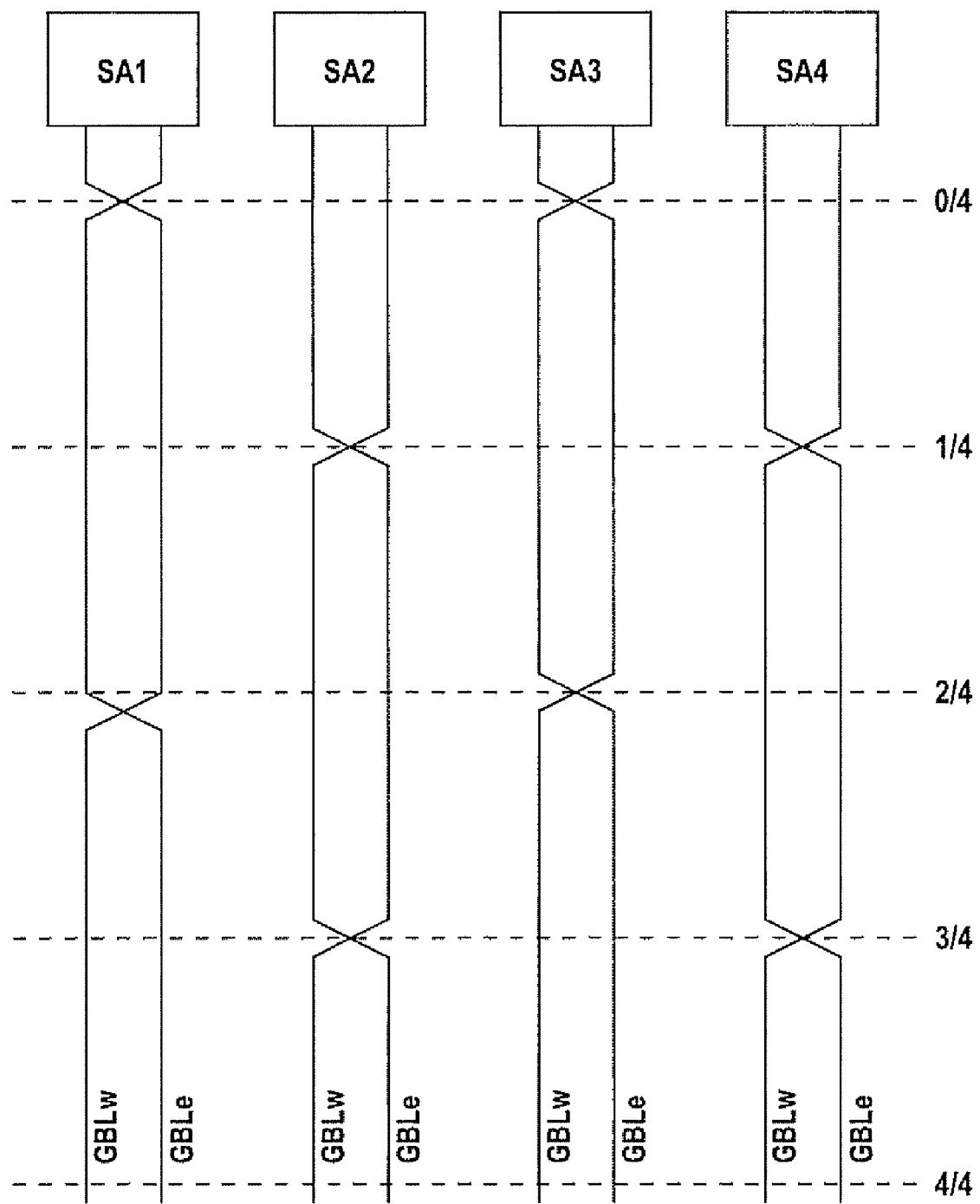
FIG. 31 illustrates a specific layout of global bit lines from a plan view in accordance with a specific embodiment of the present disclosure.

FIG. 31 illustrates a specific layout implementation of pairs of global bit lines to reduce the affects of cross talk between adjacent cells, whereby adjacent pairs of global bit lines are twisted with respect to each other at an interval equal to one-quarter of the length of a global bit line. For example, the global bit lines associated with sense amplifiers SA1 and SA3 twist at a location close to the sense amplifiers, labeled 0/4, and at a location near the center of the global bit lines, labeled 2/4. The global bit lines associated with sense amplifiers SA2 and SA4 twist at a location about one-quarter of the length global bit lines from the sense amplifiers, labeled 1/4, and at a location about three-quarters of the length of the global bit lines, labeled 3/4. Twisting the global bit lines in this manner results in any signal-cross coupling noise being distributed equally to both global bit lines in a global bit line pair such that the noise can be effectively removed by common mode rejection at the differential sense amplifiers. It will be appreciated that additional twists can be introduced between the quartiles illustrated at FIG. 31 to further ensure cancellation of noise.

It will be appreciated that other architectural features of the memory device 10 can be implemented than those specifically described above. For example, referring to FIG. 1 the sense amplifiers 17 can be formed near the center of an integrated circuit between two memory arrays. A different number than the illustrated of columns can be associated with each NAND string module. For example, more or less than four columns can be associated with each NAND string module. When one column is associated with a NAND string module, the local bit line select logic 271' and 221' is not needed. Alternatively, the number of columns associated with a specific NAND string module can be selected based upon the pitch of the sense amplifiers. For example, the number of columns associated with a pair of NAND string module can be selected to be equal to the pitch of the sense amplifiers.

The NAND string module illustrated herein uses an open drain buffer to support a sense amplifier that detects the same conductance at its inputs. In an alternate embodiment, the buffer can be a push-pull buffer formed within the columns to support a sense amplifier that detects differential signal at its inputs. The NAND string module illustrated herein includes select transistors, such as transistors 2221 and 2721 of FIG. 14. In alternate embodiments, the transistors 2221 and 2721 can be omitted and only the multiplexers 221' and 271' are used to select between NAND string modules.

Interconnects WL[0 . . . y] herein are illustrated as being logical equivalents with respect to each row of NAND strings. In an alternate embodiment, the decode module 18 can provide logically unique interconnects to each NAND string pair. For example, the decode module 18 can provide separate control signals WL[0] to each row of NAND strings to reduce the amount of capacitance being charged during a read cycle.

Alternatively, the decode module 18 can connect two or more NAND strings to the same interconnect WL[0] to reduce the silicon area of word line driver circuitry of decode module 18.

What is claimed is:
1. A device comprising:
 a sense amplifier comprising a first input and a second input;
 a global bit line to communicate information to the first input of the sense amplifier; and
 a plurality of NAND string modules, each one of the plurality of NAND string modules respectively comprising the following corresponding elements:
  a first node to communicate information to the global bit line,
  a buffer,
  a first switch comprising a control node, a first data electrode coupled to an output of the buffer, and a second data electrode, the first switch being operable to communicate information between the first data electrode and the second data electrode in response to an asserted read signal at the control node during a read access;
  a plurality of data paths, each data path of the plurality of data paths respectively comprising
   the first node,
   a corresponding NAND string of a plurality of NAND strings, and
   the buffer connected in series between the corresponding NAND string and the first node to communicate information between the corresponding NAND string and the first node, wherein a first data path of the plurality of data paths comprises the first node, the buffer, and a first NAND string of the plurality of NAND strings, and a second data path of the plurality of data paths comprises the first node, the buffer, and a second NAND string of the plurality of NAND strings.

2. The device of claim 1, wherein the buffer includes a first portion of an active region and the first NAND string includes a second portion of the active region.

3. The device of claim 1, wherein the buffer is an open drain buffer.

4. The device of claim 1, wherein each one of the plurality of NAND string modules further respectively comprises:
a second switch comprising a control node, a first data electrode coupled to the input of the buffer, and a second data electrode, the second switch being operable to communicate information between the first data electrode and the second data electrode in response to an asserted write signal at the control node during a write access.

5. The device of claim 1, wherein each one of the plurality of NAND string modules further respectively comprises:
a first transistor comprising a control input electrically connected to a second node, a first current electrode, and a second current electrode, wherein information at the output of the buffer is to be communicated to the first node via the first and second current electrodes of the first transistor.

6. The device of claim 5, wherein each one of the plurality of NAND string modules further respectively comprises:
a second transistor comprising a control input electrically connected to a third node, a first current electrode, and a second current electrode, information at the input of the buffer to be communicated to the first node via the first and second current electrodes of the second transistor.

7. The device of claim 1 further comprising:
a resistive device comprising a first current electrode electrically connected to the control input of the buffer, and a second electrode electrically coupled to a reference node, the reference node operable to provide a reference signal.

8. The device of claim 7, wherein the resistive device includes a first portion of an active region and the NAND string includes a second portion of the active region.

9. A device comprising:
a sense amplifier comprising a first input and a second input;
a global bit line to communicate information to the first input of the sense amplifier; and
a plurality of NAND string modules each one of the plurality of NAND string modules respectively comprising the following corresponding elements
a node electrically connected to the global bit line, and
a buffer to communicate information between the NAND string and the node; and
a first switch comprising a control node, a first data electrode coupled to an output of the buffer, and a second data electrode, the first switch being operable to communicate information between the first data electrode and the second data electrode in response to an asserted read signal at the control node during a read access.

10. The device of claim 9, wherein the buffer is an open drain buffer connected in series between the NAND string and the node to communicate information between the NAND string and the node during a read operation.

11. The device of claim 9 wherein the buffer is to communicate the information between the NAND string and the node during a first read operation, and to communicate bias information between a bias reference node and the node during a second read operation.

12. A method comprising:
selecting a first NAND string of a first plurality of NAND strings of a first NAND string module, the first NAND string module comprising a second plurality of NAND strings and an output, the output electrically connected to a first global bit line associated with a sense amplifier; and
communicating information at a bit line of the first NAND string to the output of the first NAND string module via a buffer and a switch coupled to the buffer in response to the first NAND string being selected and in response to an asserted read signal selecting the switch.

13. The method of claim 12, wherein the communicating the information is during a first read operation and further comprising:
selecting a second NAND string of the first plurality of NAND strings
subsequent to selecting the first NAND string; and
communicating information at a bit line of the second NAND string to the output of the NAND string module via the buffer and the switch in response to the second NAND string being selected during a second read operation and in response to an asserted read signal selecting the switch, where information at the bit line of the first NAND string is not communicated to the output of the NAND string module via the buffer when information at the bit line of the second NAND string is being communicated via the buffer.

14. The method of claim 13, further comprising:
selecting a third NAND string of the second plurality of NAND strings subsequent to selecting the first NAND string; and
communicating information at a bit line of the third NAND string to the output of the first NAND string module via the buffer and the switch in response to the third NAND string being selected, where information at the bit line of the first NAND string is not communicated to the output of the NAND string module via the buffer when information at the bit line of the first or second NAND string is being communicated via the buffer.

15. The method of claim 14, wherein the buffer is between the first plurality of NAND strings and the second plurality of NAND strings.

16. The method of claim 15, wherein the first plurality of NAND strings and the second plurality of NAND strings comprise all of the NAND strings of the first NAND string module.

17. The method of claim 14 wherein:
communicating information at the bit line of the first NAND string to the output of the first NAND string module further comprises communicating the information at the bit line of the first NAND string to the output of the first NAND string module via a first multiplexer; and
communicating information at the bit line of the third NAND string of the second plurality of NAND strings to the output of the NAND string module further comprises communicating the information at the bit line of the second NAND string to the output of the first NAND string module via a second multiplexer.

18. The method of claim 13 wherein:
communicating information at the bit line of the first NAND string to the output of the first NAND string module further comprises communicating the information at the bit line of the first NAND string to the output of the first NAND string module via a first multiplexer; and
communicating information at the bit line of the second NAND string to the output of the NAND string module further comprises communicating the information at the bit line of the second NAND string to the output of the first NAND string module via the first multiplexer.

19. The method of claim 12, wherein selecting the first NAND string is in response to the first NAND string being selected during a read cycle, and information is not communicated between the bit line of the first NAND string and the output of the NAND string module via the buffer during a write cycle.

20. The method of claim 12, further comprising:
biasing, during a read cycle of a NAND storage cell of the first NAND string, a second global bit line to a reference signal in response to selecting the first NAND string, the reference signal having a value independent of storage state of the NAND storage cell;
providing a first logic value to an output node during the read cycle in response to the reference signal when the NAND storage cell has a first storage state; and
providing a second logic value to the output node during the read access based upon the reference signal when the NAND storage cell has a second storage state.

\* \* \* \* \*

UNITED STATES PATENT AND TRADEMARK OFFICE
CERTIFICATE OF CORRECTION

| | | |
|---|---|---|
| PATENT NO. | : 7,830,716 B2 | Page 1 of 1 |
| APPLICATION NO. | : 12/134898 | |
| DATED | : November 9, 2010 | |
| INVENTOR(S) | : Bruce Lee Morton et al. | |

It is certified that error appears in the above-identified patent and that said Letters Patent is hereby corrected as shown below:

Column 26, Line 7, Claim 20, please change "independent of storage" to --independent of a storage--

Signed and Sealed this
Twenty-first Day of June, 2011

David J. Kappos
*Director of the United States Patent and Trademark Office*